United States Patent
Sueoka

(10) Patent No.: US 10,048,332 B2
(45) Date of Patent: *Aug. 14, 2018

(54) MAGNETIC RESONANCE IMAGING APPARATUS AND MAGNETIC RESONANCE IMAGING METHOD

(71) Applicant: Kazuhiro Sueoka, Nasushiobara (JP)

(72) Inventor: Kazuhiro Sueoka, Nasushiobara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1581 days.

This patent is subject to a terminal disclaimer.

(21) Appl. No.: 13/719,699

(22) Filed: Dec. 19, 2012

(65) Prior Publication Data

US 2013/0154642 A1 Jun. 20, 2013

(30) Foreign Application Priority Data

Dec. 19, 2011 (JP) .................................. 2011-277605

(51) Int. Cl.
*G01R 33/34* (2006.01)
*G01R 33/565* (2006.01)

(52) U.S. Cl.
CPC . *G01R 33/34015* (2013.01); *G01R 33/56563* (2013.01)

(58) Field of Classification Search
CPC ........ G01R 33/34015; G01R 33/56563; G01R 33/56572; G01R 33/3873; G01R 33/4804
(Continued)

(56) References Cited

U.S. PATENT DOCUMENTS 6,507,262 B1 1/2003 Otte et al.
8,797,032 B2 * 8/2014 Ookawa ................. A61B 5/055
324/314
(Continued)

FOREIGN PATENT DOCUMENTS

JP              01-303141 A1    12/1989
JP       (1992)4-083316          3/1992
(Continued)

OTHER PUBLICATIONS

JP Office Action dated Sep. 8, 2015 in in JP 2011-277605.
(Continued)

*Primary Examiner* — Rishi Patel
(74) *Attorney, Agent, or Firm* — Nixon & Vanderhye P.C.

(57) ABSTRACT

In one embodiment, an MRI apparatus (20) includes "a temperature measuring unit (70A to 70D) performing temperature measurement of a gradient magnetic field coil unit (26)", a data storing unit (100), a pulse setting unit (102), and an imaging unit. The data storing unit stores the first and second data indicating a shift of a center frequency of magnetic resonance of hydrogen atoms. The first data corresponds to a case of temperature rise of the gradient magnetic field coil unit, and the second data corresponds to a case of temperature fall of that. The pulse setting unit corrects a center frequency of an RF pulse by calculating an estimated shift of the center frequency based on data corresponding to result of the temperature measurement out of the first and second data. The imaging unit performs magnetic resonance imaging based on the corrected RF pulse.

17 Claims, 7 Drawing Sheets

(58) Field of Classification Search
USPC .................................. 324/309; 600/407–422
See application file for complete search history.

(56) References Cited

U.S. PATENT DOCUMENTS

| | | | |
|---|---|---|---|
| 2009/0069666 A1* | 3/2009 | Hermosillo Valadez | G01R 33/56563 600/410 |
| 2010/0085053 A1* | 4/2010 | Iwasa | G01R 33/3804 324/318 |
| 2010/0315086 A1 | 12/2010 | Sakakura | |
| 2012/0001635 A1* | 1/2012 | Ookawa | A61B 5/055 324/314 |

FOREIGN PATENT DOCUMENTS

| | | |
|---|---|---|
| JP | 2563097 | 9/1996 |
| JP | 2002-530854 | 9/2002 |
| JP | 2005-288025 | 10/2005 |
| JP | 2009-240765 | 10/2009 |

OTHER PUBLICATIONS

Zhang Yanzhong, "Temperature Dependence of Initial Permeability and Hysteresis Loop of Ferromagnetic Amorphous Alloys," Journal of Iron and Steel Research, vol. 3, No. 2, Jun. 1991, pp. 47-56.
CN Office Action dated Jul. 2, 2014 in CN 201210554762.7.

* cited by examiner

MAGNETIC RESONANCE IMAGING APPARATUS AND MAGNETIC RESONANCE IMAGING METHOD

CROSS-REFERENCE TO RELATED APPLICATION

This application is based upon and claims the benefit of priority from Japanese Patent Application No. 2011-277605, filed on Dec. 19, 2011;

The entire contents of which are incorporated herein by reference.

BACKGROUND OF THE INVENTION

1. Field of the Invention

Embodiments described herein relate generally to magnetic resonance imaging.

2. Description of the Related Art

MRI is an imaging method which magnetically excites nuclear spins of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

An MRI apparatus has a gradient magnetic field coil that applies a gradient magnetic field to an imaging space in which an object is placed, thereby providing an MR signal with spatial positional information, in its gantry. The gradient magnetic field coil generates significant heat during imaging because of a pulse current repeatedly supplied thereto. As the temperature of the gradient magnetic field coil rises, the magnetic field in the imaging region varies, and the center frequency of the magnetic resonance of hydrogen atoms in the object also varies, as a result.

Japanese Patent Laid-Open No. 2005-288025 discloses a known conventional technique relating to detection of the variation of the resonance frequency.

According to the Japanese Patent Laid-Open No. 2005-288025, variation of the resonance frequency in the imaging cross section is estimated based on the variation of a temperature measured by a temperature sensor disposed in the gantry. Then, the frequency of a reference clock of a control system is modified to follow the variation of the resonance frequency, and respective units are controlled based on the modified reference clock, thereby reduction of the influence of the disturbance in the static magnetic field homogeneity is attempted.

The center frequency of an RF pulse, such as a fat suppression prepulse and a 90° excitation pulse, is set based on the Larmor frequency of hydrogen atoms that depends on the intensity of the static magnetic field during an imaging preparation step such as a prescan. However, if the center frequency of the magnetic resonance of the hydrogen atoms shifts because of the heat generation of the gradient magnetic field coil during imaging after the conditions concerning RF pulses is set in the imaging preparation step, it becomes a contributory factor of degrading image quality.

For example, in imaging which takes a long time such as dynamic imaging, images whose data are acquired at later points in time suffer influence of a lager shift of the center frequency of the magnetic resonance due to the heat generation of the gradient magnetic field coil. Accordingly, in imaging which takes a long time, image quality of images whose data are acquired at later points in time may be more degraded because of the degradation of the effect of the fat suppression prepulse.

Therefore, a novel technology to obtain a high-quality image regardless of shift of a center frequency of magnetic resonance of hydrogen atoms caused by heat generation of a gradient magnetic field coil has been desired in MRI.

DETAILED DESCRIPTION

Figure 1:
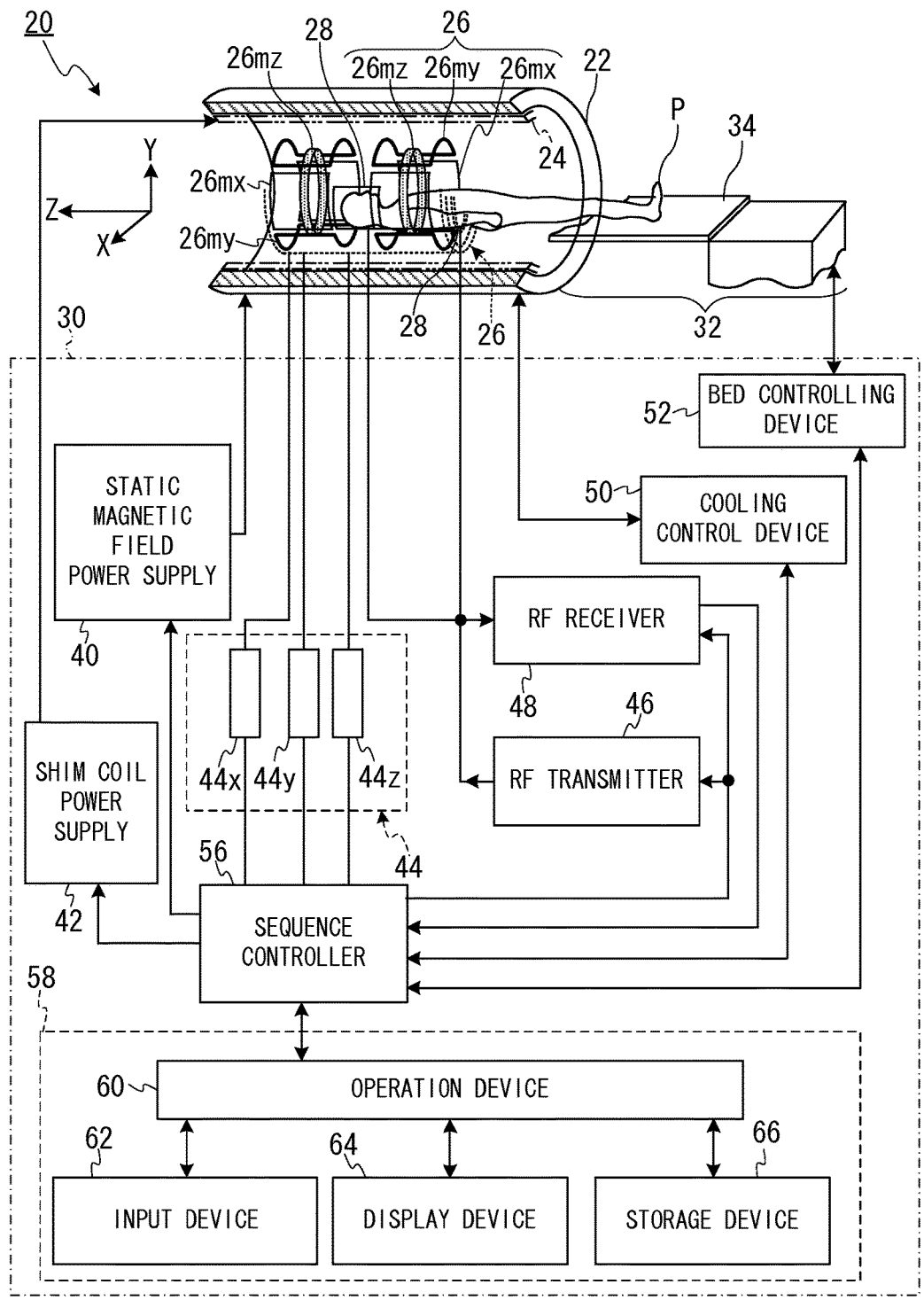
FIG. 1 is a block diagram showing general structure of the MRI apparatus of the present embodiment.

Hereinafter, examples of aspects which embodiments of the present invention can take will be explained per aspect.

(1) According to one embodiment, an MRI apparatus includes a gradient magnetic field coil unit, a temperature measuring unit, a data storing unit, a pulse setting unit and an imaging unit.

The gradient magnetic field coil unit generates a gradient magnetic field in an imaging region according to an electric current supplied thereto.

The temperature measuring unit performs temperature measurement of the gradient magnetic field coil unit.

The data storing unit stores the first data corresponding to a case of temperature rise of the gradient magnetic field coil unit and "the second data corresponding to a case of temperature fall of the gradient magnetic field coil unit". Both of the first and second data indicate a shift of a center frequency of magnetic resonance of a hydrogen atom in the imaging region, as shift data.

The pulse setting unit performs judgment as to whether temperature of the gradient magnetic field coil unit has risen or fallen based on the result of the temperature measurement. The pulse setting unit calculates an estimated shift of the center frequency of magnetic resonance based on data corresponding to the result of the judgment out of the first data and the second data. The pulse setting unit corrects a center frequency of an RF pulse based on the estimated shift.

The imaging unit transmits the RF pulse corrected by the pulse setting unit, acquires nuclear magnetic resonance signals from an object in the imaging region, and generates image data of the object based on the nuclear magnetic resonance signals.

(2) According to another embodiment, an MRI apparatus includes a gradient magnetic field coil unit, a temperature measuring unit, a data storing unit, a pulse setting unit and an imaging unit. Each configuration of a gradient magnetic field coil unit, a temperature measuring unit and an imaging unit is the same as the MRI apparatus of the above (1).

In this configuration, the data storing unit stores a plurality of shift data which correspond to a plurality of temperature regions respectively and indicate shift of a center frequency of magnetic resonance of a hydrogen atom in the imaging region in response to temperature variation of the gradient magnetic field coil unit.

Additionally, in this configuration, the pulse setting unit calculates an estimated shift of the center frequency of the magnetic resonance of the hydrogen atom based on temperature shift of the gradient magnetic field coil unit indicated by the temperature measurement and the shift data corresponding to a temperature region including temperature of the gradient magnetic field coil unit indicated by the temperature measurement, and corrects a center frequency of an RF pulse based on the estimated shift.

(3) According to another embodiment, an MRI method includes the following steps.

One of the steps is to perform temperature measurement of a gradient magnetic field coil unit of a magnetic resonance apparatus.

Another of the steps is to perform judgment as to whether temperature of the gradient magnetic field coil unit has risen or fallen, based on result of the temperature measurement.

Another of the steps is to calculate an estimated shift of a center frequency of magnetic resonance of a hydrogen atom in an imaging region based on data corresponding to result of the judgment out of first data corresponding to a case of temperature rise of the gradient magnetic field coil unit and second data corresponding to a case of temperature fall of the gradient magnetic field coil unit. The first and second data indicate a shift of the center frequency of magnetic resonance.

Another of the steps is to correct a center frequency of an RF pulse based on the estimated shift.

Another of the steps is to acquire nuclear magnetic resonance signals from an object in the imaging region by transmitting the RF pulse whose center frequency is corrected based on the estimated shift.

The other of the steps is to generate image data of the object based on the nuclear magnetic resonance signals.

A magnetic resonance imaging apparatus and a magnetic resonance imaging method according to embodiments of the present invention will be described with reference to the accompanying drawings. Note that the same reference numbers are given for identical components in each figure, and overlapping explanation is abbreviated.

(Configuration of the MRI Apparatus)

FIG. 1 is a block diagram showing general structure of the MRI apparatus 20 according to an embodiment of the present invention.

As shown in FIG. 1, the MRI apparatus 20 includes a cylinder-shaped static magnetic field magnet 22 for generating a static magnetic field, a cylinder-shaped shim coil 24 coaxially-arranged inside the static magnetic field magnet 22, a gradient magnetic field coil unit 26, RF coils 28, a control device 30, and a bed 32. The bed 32 includes a table 34 for placing an object (e.g. a patient) P on it, and movably supports the table 34.

Here, as one example, an apparatus coordinate system, whose X axis, Y axis and Z axis are perpendicular to each other, is defined as follows. Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction. Moreover, the bed 32 is disposed in such a position that the direction of the normal line of the loading plane of its table 34 on which an object is put is the same as the Y axis direction.

The control device 30 includes a static magnetic field power supply 40, a shim coil power supply 42, a gradient magnetic field power supply 44, an RF transmitter 46, an RF receiver 48, a cooling control device 50, a bed controlling device 52, a sequence controller 56 and a computer 58.

The gradient magnetic field power supply 44 includes an X axis gradient magnetic field power supply 44x, a Y axis gradient magnetic field power supply 44y and a Z axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40. The aforementioned imaging space means, for example, a space in a gantry in which an object P is placed and to which a static magnetic field is applied. The term gantry refers to a structure having a cylindrical shape, for example, which includes a static magnetic field magnet 22, a shim coil 24, a gradient magnetic field coil unit 26, and RF coils 28. For simplicity, FIG. 1 does not show the gantry itself but shows the static magnetic field magnet 22 and so on as components of the gantry.

The imaging region means, for example, a region set as a part of the imaging space and is a range of acquisition of MR signals used to generate one image or one set of image. Here, one set of images means, for example, a plurality of images when MR signals of the plurality of images are acquired in a lump in one pulse sequence such as multi-slice imaging.

The static magnetic field magnet 22 includes a superconductivity coil in many cases. The static magnetic field magnet 22 gets an electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil unit 26 includes an X axis gradient magnetic field coil 26mx, a Y axis gradient magnetic field coil 26my and a Z axis gradient magnetic field coil 26mz. Each of the X axis gradient magnetic field coil 26mx, the Y axis gradient magnetic field coil 26my and the Z axis gradient magnetic field coil 26mz is cylinder-shaped and arranged inside the static magnetic field magnet 22. The X axis gradient magnetic field coil 26mx, the Y axis gradient magnetic field coil 26my and the Z axis gradient magnetic field coil 26mz are electrically connected to the X axis gradient magnetic field power supply 44x, the Y axis gradient magnetic field power supply 44y and the Z axis gradient magnetic field power supply 44z of the gradient magnetic field power supply 44 respectively.

The X axis gradient magnetic field power supply 44x, the Y axis gradient magnetic field power supply 44y and the Z axis gradient magnetic field power supply 44z supply electric currents to the X axis gradient magnetic field coil 26mx, the Y axis gradient magnetic field coil 26my and the Z axis gradient magnetic field coil 26mz respectively so as to generate a gradient magnetic field Gx in the X axis direction, a gradient magnetic field Gy in the Y axis direction and a gradient magnetic field Gz in the Z axis direction in the imaging region.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining gradient magnetic fields Gx, Gy and Gz in the X axis, Y axis and Z axis directions as three physical axes. The gradient magnetic fields Gss, Gpe and Groin the slice selection direction, the phase encoding direction and the readout direction are superimposed on the static magnetic field.

The RF transmitter 46 generates RF pulses (RF current pulse) of the Larmor frequency for causing nuclear magnetic resonance in accordance with control information provided from the sequence controller 56, and outputs the generated RF pulses to the transmission RF coil 28.

The RF coils 28 include a whole body coil built in the gantry for transmission and reception of RF pulses and local coils arranged around the table 34 or the object P for reception of RF pulses.

The transmission RF coil 28 transmits an RF pulse given from the RF transmitter 46 to the object P. The reception RF coil 28 receives MR signals generated due to excited nuclear spin inside the object P by the RF pulse and these MR signals are detected by the RF receiver 48.

The RF receiver 48 generates raw data which are digitized complex number data of MR signals obtained by performing A/D (analogue to digital) conversion after performing predetermined signal processing to the detected MR signals. The RF receiver 48 inputs the generated raw data of MR signals to the sequence controller 56.

The cooling control device 50 circulates cooling medium such as coolant water and antifreeze liquid, in a cooling pipes 76 (see FIG. 3) described later under the control of a sequence controller 56, thereby suppressing heat generation of the gradient magnetic field coil unit 26.

The operation device 60 performs system control of the MRI apparatus 20 in imaging operation, and its function will be explained later with FIG. 4.

The sequence controller 56 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X axis, Y axis and Z axis directions and RF pulses by driving the gradient magnetic field power supply 44, the RF transmitter 46 and the RF receiver 48 according to a predetermined sequence stored. Additionally, the sequence controller 56 receives raw data of MR signals inputted from the RF receiver 48, and input the raw data to the operation device 60.

The bed controlling device 52 is connected to the operation device 60 via the sequence controller 56. The sequence controller 56 moves the table 34 of the bed 32 in the Z axis direction of the apparatus coordinate system by controlling the bed controlling device 52 under the command of the operation device 60. This allows imaging according to a moving-table method or a stepping-table method.

Figure 2:
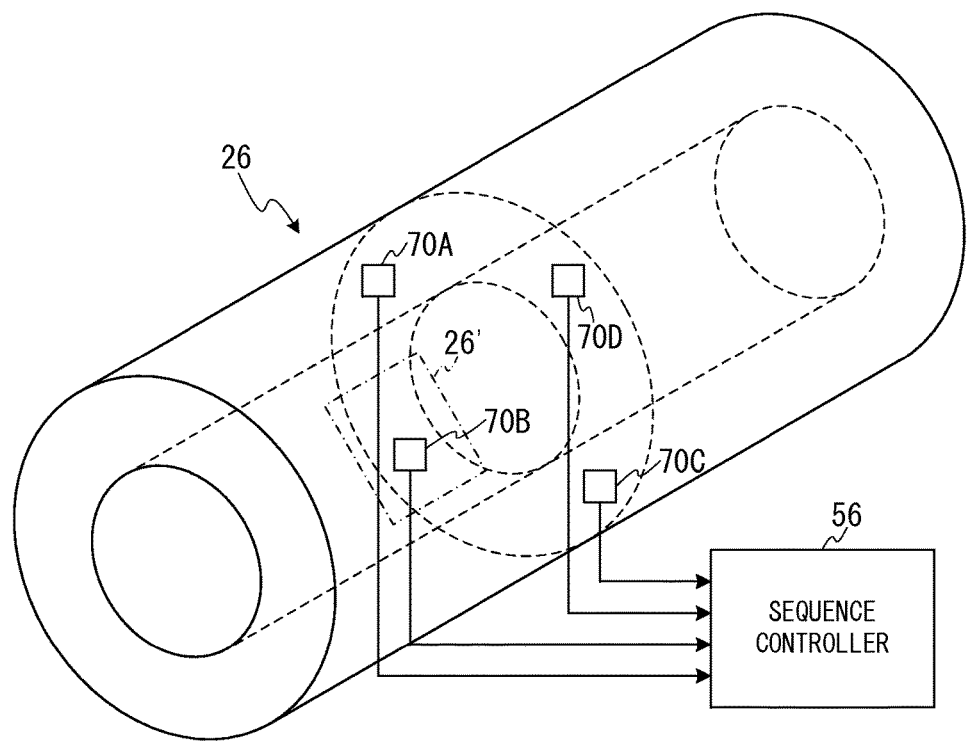
FIG. 2 is a schematic perspective view showing an example of arrangement of temperature sensors in a gradient magnetic field coil unit.

FIG. 2 is a schematic perspective, view showing an example of arrangement of temperature sensors in the gradient magnetic field coil unit 26. Four temperature sensors 70A, 70B, 70C, and 70D are arranged at regular intervals along a cylindrical static magnetic field magnet 22 in an annular cross section thereof in "an X-Y plane in the apparatus coordinate system including a point that constitutes the magnetic field center during imaging". The temperature sensors 70A, 70B, 70C and 70D input detected temperatures to the sequence controller 56, respectively. Note that, the arrangement and the number of the temperature sensors shown in FIG. 2 are only an example, and the arrangement and the number of temperature sensors are not limited to those in the example described above.

Figure 3:
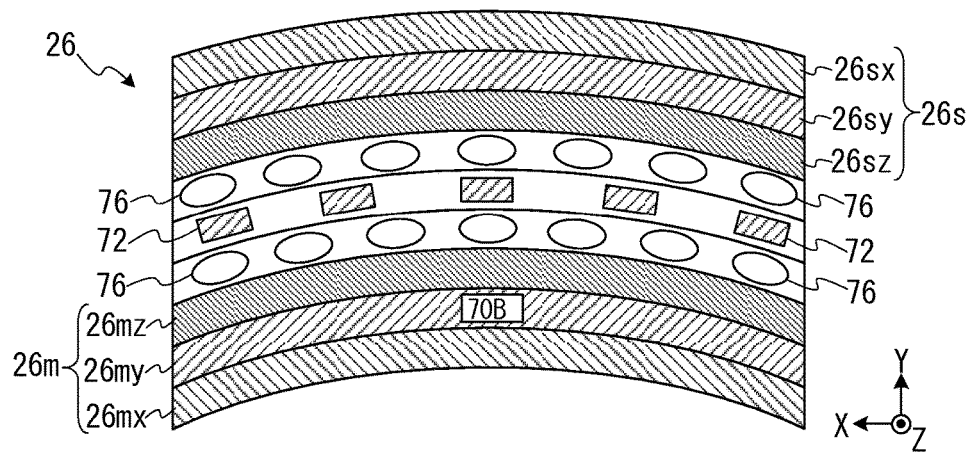
FIG. 3 is a schematic cross-sectional view of the gradient magnetic field coil unit shown in FIG. 2.

FIG. 3 is a schematic cross-sectional view of the gradient magnetic field coil unit 26 shown in FIG. 2 and shows a cross section of a region defined by an alternate long and short dash line 26' in FIG. 2. As shown in FIG. 3, the gradient magnetic field coil unit 26 has a multilayer structure incorporating an active shield.

More specifically, the gradient magnetic field coil unit 26 has a layer of a main coil 26m, a layer of a shield coil 26s, and 'an insertion layer including a plurality of shim trays 72' and 'embedded layers including a plurality of cooling pipes 76' interposed between the layer of the main coil 26m and the layer of the shield coil 26s. In FIG. 3, each of the shim trays 72 is shown as a shaded rectangular region, and each of the cooling pipes 76 is shown as a white elliptical region.

The main coil 26m includes the X axis gradient magnetic field coil 26mx, the Y axis gradient magnetic field coil 26my, and the Z axis gradient magnetic field coil 26mz, which produce the gradient magnetic fields Gx, the gradient magnetic fields Gy, and the gradient magnetic fields Gz in the imaging region, respectively.

The shield coil 26s includes an X axis shield coil 26sx, a Y axis shield coil 26sy, and a Z axis shield coil 26sz, which produce magnetic fields when electric currents are supplied thereto from the gradient magnetic field power supply 44 respectively.

Specifically, the X axis shield coil 26sx, the Y axis shield coil 26sy, and the Z axis shield coil 26sz produce magnetic fields in a region outside the main coil 26m. The three magnetic fields respectively produced by X axis shield coil 26sx, the Y axis shield coil 26sy, and the Z axis shield coil 26*sz* correspond to the X axis gradient magnetic field coil 26*mx*, the Y axis gradient magnetic field coil 26*my* and the Z axis gradient magnetic field coil 26*mz* respectively, and shield the gradient magnetic fields Gx, Gy and Gz produced by the main coil 26M, respectively.

A plurality of shim trays 72 are disposed at substantially regular intervals between the embedded layer of cooling pipes 76 closer to the main coil 26*m* and the embedded layer of cooling pipes 76 closer to the shield coil 26*s*. Since the cooling medium is circulated in the cooling pipes 76, heat generated by the main coil 26*m* and the shield coil 26*s* is less likely to transmit to the shim trays 72. The shim trays 72 are, for example, made of a nonmagnetic and nonconductive resin and substantially rod-shaped and extend in the Z axis direction. Each of the shim trays 72 contains a predetermined number of iron shims (not shown). The iron shims have an effect of uniformizing magnetic field intensity distribution of the static magnetic field formed in the imaging space (effect of correcting non-uniformity of the static magnetic field).

Note that, in the arrangement shown in FIG. 3, the temperature sensors 70A to 70D detect the temperature of the Y axis gradient magnetic field coil 26*my*, and this is only an example. In an alternative arrangement, more temperature sensors may be used to separately detect the temperature of the X axis gradient magnetic field coil 26*mx*, the Y axis gradient magnetic field coil 26*my*, the X axis shield coil 26*sx*, the Y axis shield coil 26*sy*, and the Z axis shield coil 26*sz* respectively. As a further alternative, the temperature sensors 70A to 70D may detect the temperatures of the shim trays 72. That is, any arrangement is possible as far as the temperature of the gradient magnetic field coil unit 26 can be detected.

Note that, an arrangement that directly and accurately detects the temperature of an element that is directly involved with the intensity of the magnetic field in the imaging region is preferable. In this respect, detecting the temperature of the shim trays 72 containing the iron shims or the main coil 26*m* is superior to detecting the temperature of the cooling pipes 76 and their surroundings. This is because the temperature of regions located adjacent to the cooling pipes 76 in which cooling medium circulates is the lowest inside the gradient magnetic field coil unit 26.

The temperature sensors 70A to 70D may be infrared radiation thermometers, or thermistors or thermocouples that substantially directly measure the temperature of the main coil 26*m*. The infrared radiation thermometer is capable of measuring the temperature of a measurement object in a noncontact manner, and therefore is advantageous in terms of taking a shorter time for measuring temperature. In this respect, the infrared radiation thermometer is superior to "measurement methods requiring that the temperatures of the temperature sensor and the object have to become equal by heat transfer".

Figure 4:
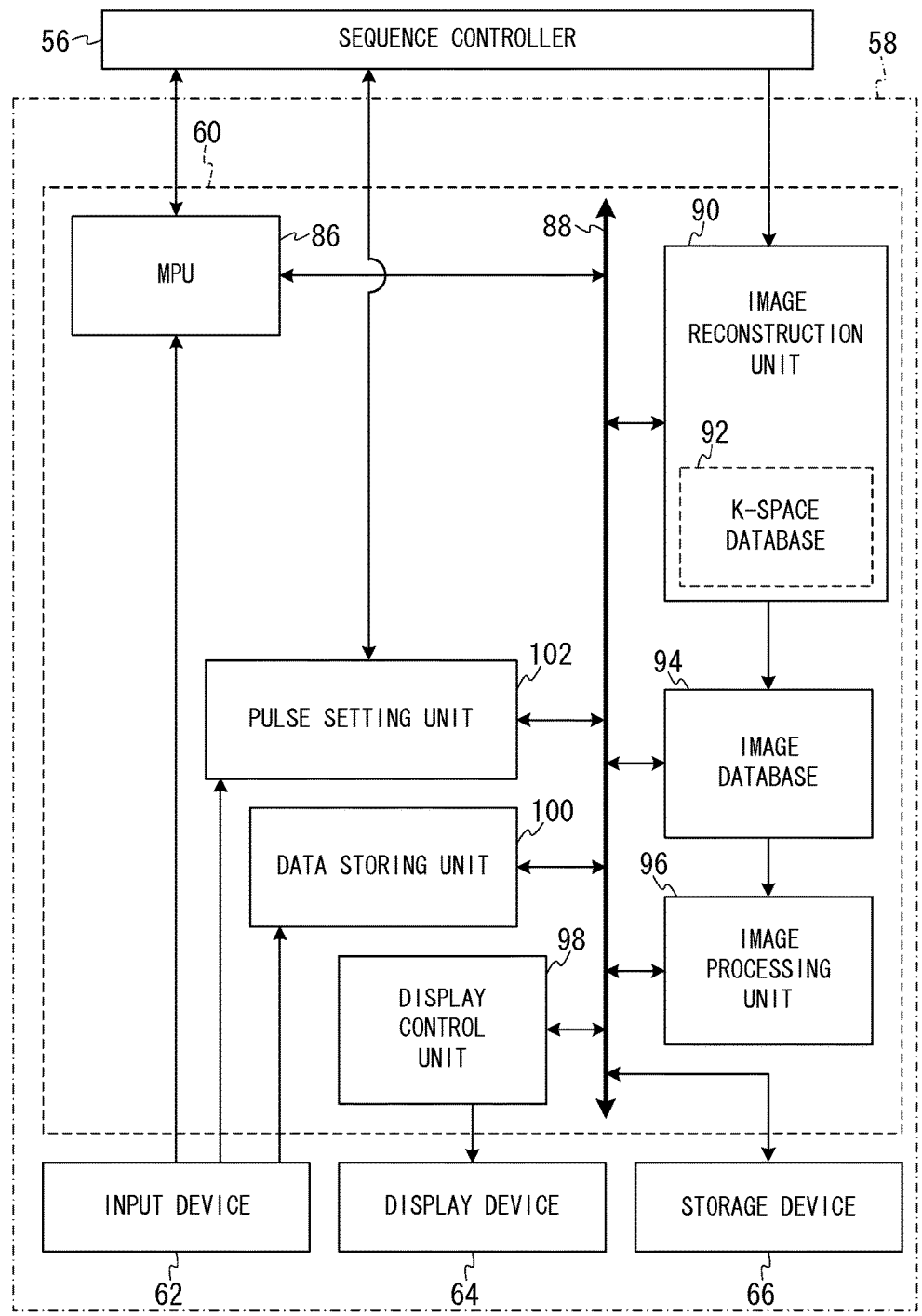
FIG. 4 is a functional block diagram of the computer 58 shown in FIG. 1.

FIG. 4 is a functional block diagram of the computer 58 shown in FIG. 1. The operation device 60 of the computer 58 includes an MPU (Micro Processor Unit) 86, a system bus 88, an image reconstruction unit 90, an image database 94, an image processing unit 96, a display controlling unit 98, a data storing unit 100, and a pulse setting unit 102.

The MPU 86 performs system control of the MRI apparatus 20 in setting of imaging conditions, imaging operation and image display after imaging through interconnection such as the system bus 88.

The aforementioned term imaging condition refers to under what condition an RF signal or the like is transmitted in what type of pulse sequence such as spin echo, or under what condition MR signals are acquired from an object, for example. As a parameter of the imaging conditions, for example, there are the imaging region as positional information in the imaging space, a flip angle, a repetition time, the number of slices, an imaging part, and the type of the pulse sequence. The aforementioned term imaging part means a region of the object P to be imaged, such as a head part and a chest part.

The aforementioned main scan is a scan for imaging an intended diagnosis image such as a T1 weighted image, and it does not include a scan for acquiring MR signals for a scout image or a calibration scan such as a prescan. A scan is an operation of acquiring MR signals, and it does not include image reconstruction processing. The above prescan is, for example, a scan for calibration to determine unconfirmed elements of imaging conditions of the main scan, conditions and data used for image reconstruction processing after the main scan and so on, and it is performed separately before the main scan.

Additionally, the MPU 86 functions as imaging conditions setting unit, sets imaging conditions including a pulse sequence such as Spin Echo based on command information from the input device 62, and inputs the set imaging conditions into the sequence controller 56. In order to achieve it, the MPU 86 controls the display controlling unit 98 and displays information for setting imaging conditions on the display device 64.

The input device 62 provides a user with a function to set imaging conditions and image processing conditions.

The image reconstruction unit 90 includes a k-space database 92 inside. The image reconstruction unit 90 arranges raw data of MR signals inputted from the sequence controller 56 in the k-space formed in the k-space database 92 as k-space data. The image reconstruction unit 90 generates image data of each slice of the object P by performing image reconstruction processing including such as two-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display controlling unit 98 displays a screen for setting imaging conditions and an image indicated by generated image data through imaging on the display device 64 under control of the MPU 86.

The data storing unit 100 stores temperature coefficients each of which indicates a relationship between the variation of the temperature of the gradient magnetic field coil unit 26 and the shift of the center frequency of the magnetic resonance of hydrogen atoms. The temperature coefficients are generated and recorded in a temperature coefficient acquisition sequence described later performed during installation of the MRI apparatus 20, for example. Note that, the temperature coefficient acquisition sequence is not necessarily performed as a part of an installation adjustment during installation, but can also be performed to calibrate the temperature coefficients during a regular inspection, for example.

The pulse setting unit 102 acquires the temperatures detected by the temperature sensors 70A, 70B, 70C and 70D via the sequence controller 56, and calculates the temperature variation of the gradient magnetic field coil unit 26. Thereby, the pulse setting unit 102 sets (corrects) the center frequency of an RF pulse based on the aforementioned temperature coefficients. The RF pulse referred to herein may be a fat suppression prepulse, a region-selective presaturation pulse, or a 90° excitation pulse or refocusing pulse for data acquisition.

Description of Principle According to Embodiment

Figure 5:
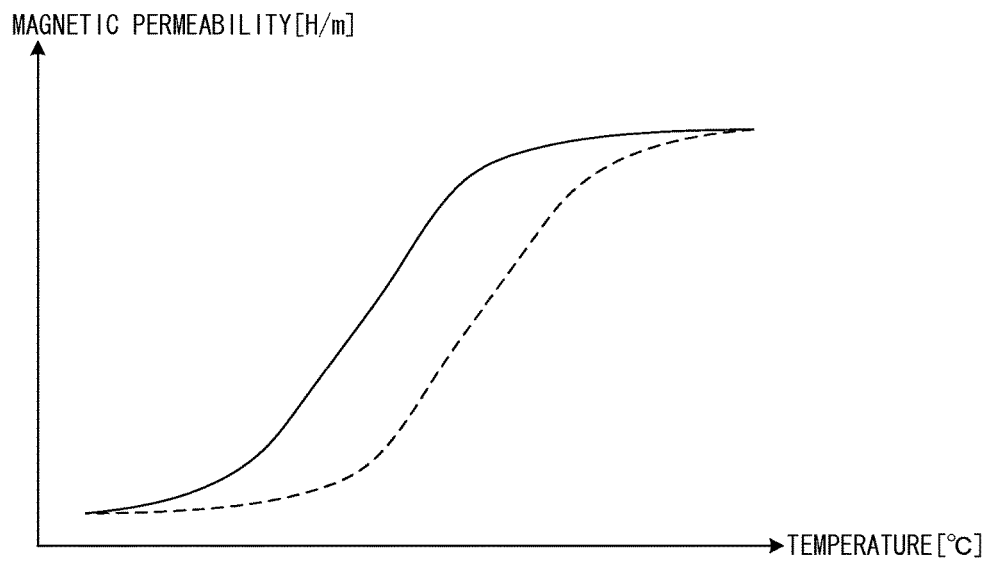
FIG. 5 is a schematic diagram showing temperature variation of magnetic permeability of iron shims inserted in a gradient magnetic field coil unit.

FIG. 5 is a schematic diagram showing temperature variation of magnetic permeability of iron shims inserted in the gradient magnetic field coil unit 26. In FIG. 5, the vertical axis indicates magnetic permeability (henry/meter) of iron shims, the horizontal axis indicates temperature (° C.), the solid line indicates the magnetic permeability of the iron shims during temperature rising process, and the dashed line indicates the magnetic permeability of the iron shims during temperature falling process. As shown in FIG. 5, the magnetic permeability of the iron shims in the temperature rising process and the magnetic permeability of the iron shims in the temperature falling process are different from each other even in the same temperature. This is because the magnetic permeability of the iron shims has hysteresis behavior to temperature variation.

Note that, as reasons for the hysteresis behavior of the magnetic permeability of the iron shims to temperature variation, for example, the following three factors are presumable. Firstly, temperature rise of the gradient magnetic field coil unit 26 is a supposable cause. Secondly, influence of eddy current is a supposable cause. Thirdly, heat generation caused by polarity reversion of a gradient magnetic field of a pulse sequence such as, for example, EPI (Echo Planar Imaging) is a supposable cause.

That is, even if temperature of the gradient magnetic field coil unit 26 (temperature of the iron shims) is the same, magnetic field intensity (tesla) in the imaging region is different between a temperature rising period and a temperature falling period due to difference of the magnetic permeability of the iron shims. Thus, even if the temperature of the gradient magnetic field coil unit 26 (temperature of the iron shims) is the same, the center frequency of magnetic resonance of hydrogen atoms in the imaging region is different between a temperature rising period and a temperature falling period. This is because the Larmor frequency is in proportion to intensity of applied magnetic field.

Then, in the present embodiment, as temperature coefficients groups which respectively indicate relationship between amount of temperature shift of the gradient magnetic field coil unit 26 and shift amount of the center frequency of magnetic resonance of hydrogen atoms, the first data corresponding to the temperature rising process and the second data corresponding to the temperature falling process are used. Here, as an example, the first data are acquired by performing the first temperature coefficient acquisition sequence, and the second data are acquired by performing the second temperature coefficient acquisition sequence.

As the first temperature coefficient acquisition sequence, for example, a pulse sequence which makes the temperature of the gradient magnetic field coil unit 26 rise in proportion to elapsed time is performed, and detected temperatures of each of the temperature sensors 70A, 70B, 70C and 70D are acquired as measured data per elapsed time during implementation term of this pulse sequence. At the same time, the center frequencies of magnetic resonance of hydrogen atoms inside a phantom such as, for example water, are acquired as data per elapsed time by, for example, detecting the position of the peak frequency of frequency spectrums of MR signals by magnetic resonance spectroscopy. Then, how much the center frequency shifts depending on variation amount of the temperature inside the gradient magnetic field coil unit 26 based on the measurement results is calculated, and these calculation results are stored in the data storing unit 100 as the first data.

Here, in the temperature range in which the MRI apparatus 20 is used, the temperature variation of the magnetic permeability of the iron shims does not completely accord with a linear function variation. Thus, the first data are acquired per temperature region. In the present embodiment, as an example, the temperature coefficients as the first data are calculated for the following first to third temperature regions, respectively. The first temperature region is a temperature range from 0° C. to 20° C. (the first temperature region includes exactly 0° C., but does not include exactly 20° C.). The second temperature region is a temperature range from 20° C. to 40° C. (the second temperature region includes exactly 20° C., but does not include exactly 40° C.). The third temperature region is a temperature range from 40° C. to 60° C. (the third temperature region includes exactly 40° C., but does not include exactly 60° C.).

More specifically, the cooling control device 50 cools the cooling medium circulating inside the gradient magnetic field coil unit 26 down to a predetermined temperature approximately 0° C. If the cooling medium is water, the predetermined temperature approximately 0° C. may be set to 1° C., for example.

Next, after detected temperatures of each of the temperature sensors 70A, 70B, 70C and 70D converged at the "predetermined temperature approximately 0° C.", the first temperature coefficient acquisition sequence is started at the start time t0. Additionally, at time t0, the center frequency of magnetic resonance of hydrogen atoms is acquired as "the center frequency at time t0" by magnetic resonance spectroscopy.

Furthermore, the MRI apparatus 20 makes each of the temperature sensors 70A, 70B, 70C and 70D start performing temperature measurement at specified time intervals after time t0, and makes them input the measured temperatures per elapsed time to the data storing unit 100 in series.

Then, while the detected temperatures of each of the temperature sensors 70A, 70B, 70C and 70D are in the first temperature region, the MRI apparatus 20 acquires "the center frequencies of magnetic resonance of hydrogen atoms" as data per elapsed time at different time points (for example, four times or more).

Here, since the sensitivity varies with the individual temperature sensors 70A to 70D, a temperature coefficient, which indicates the shift (Hz) of the center frequency in response to a unit temperature rise (1 Kelvin, i.e. 1° C.) of the detected temperature is determined for each of the temperature sensors 70A to 70D as the first data. Here, as an example, a unit of the temperature coefficients is defined as a unit which is obtained by dividing the unit of frequency (hertz) by the unit of temperature (Kelvin). This is so that the product of a temperature variation amount times the temperature coefficient is calculated as a shift amount of the center frequency.

Additionally, as to the terminal character of symbols of the temperature coefficients and slopes of graphs used in the following calculation, α indicates the first temperature region, β indicates the second temperature region, and γ indicates the third temperature region, respectively.

Additionally, as to the second character from the final character of symbols of the temperature coefficients and slopes of graphs, a indicates the temperature sensor 70A, b indicates the temperature sensor 70B, c indicates the temperature sensor 70C, and d indicates the temperature sensor 70D, respectively.

Additionally, as to the third character from the final character of symbols of the temperature coefficients and slopes of graphs, h indicates a case of the temperature rising process, and r indicates a case of the temperature falling process, respectively.

The temperature rise amount obtained from measured temperatures per elapsed time of the temperature sensor 70A in the first temperature region is defined as $\Delta Tha\alpha$, and the shift amount of the center frequency corresponding to this temperature rise amount is defined as $\Delta Hha\alpha$. The data storing unit 100 determines the temperature coefficient $Kha\alpha$ of the temperature sensor 70A in the first temperature region as $Kha\alpha = \Delta Hha\alpha / \Delta Tha\alpha$.

Specifically, for example, assume a case where the MRI apparatus 20 has acquired the center frequencies at time t1, time t2, time t3, time t4 and time t5 at which measured temperatures of each of the temperature sensors 70A, 70B, 70C and 70D are in the first temperature region by magnetic resonance spectroscopy, respectively (time t1 to time t5 are after time t0). In this case, the data storing unit 100 generates the first graph in which each measured temperature of the temperature sensor 70A at time t1 to time t5 is plotted as the value of the vertical axis and elapsed time from time t0 of each of time t1 to time t5 is plotted as the value of the horizontal axis. The data storing unit 100 calculates the slope (tilt) of the first graph as $Tha\alpha$ by a least-square method.

Next, the data storing unit 100 generates the second graph in which each shift amount of the center frequencies at time t1 to time t5 is plotted as the value of the vertical axis and elapsed time from time t0 of each of time t1 to time t5 is plotted as the value of the horizontal axis. The above shift amount of the center frequencies is each margin between each center frequency at time t1 to time t5 obtained by magnetic resonance spectroscopy and the center frequency at time t0. The data storing unit 100 calculates the slope of the second graph as $Hha\alpha$ by a least-square method.

The data storing unit 100 calculates the temperature coefficient $Kha\alpha$ of the temperature sensor 70A in the first temperature region as the first data, by dividing the slope $Hha\alpha$ of the second graph by the slope $Tha\alpha$ of the first graph.

The data storing unit 100 calculates the temperature coefficient $Khb\alpha$ of the temperature sensor 70B in the first temperature region of the temperature rising process as the first data in the way similar to the above manner. The data storing unit 100 calculates the temperature coefficient $Khc\alpha$ of the temperature sensor 70C in the first temperature region of the temperature rising process as the first data in the way similar to the above manner. The data storing unit 100 calculates the temperature coefficient $Khd\alpha$ of the temperature sensor 70D in the first temperature region of the temperature rising process as the first data in the way similar to the above manner.

After this, the first temperature coefficient acquisition sequence is continued, and the measured temperatures of each of the temperature sensors 70A, 70B, 70C and 70D rise to a temperature in the second temperature region, respectively. Then, for example, the MRI apparatus 20 acquires the center frequencies at time t6, time t7, time t8, time t9, and time t10 at which measured temperatures of each of the temperature sensors 70A, 70B, 70C and 70D belong to the second temperature region, respectively. Next, a slope of a graph in which each measured temperature of the temperature sensor 70A at time t6 to time t10 is plotted as a value of the vertical axis and each elapsed time of time t6 to time t10 (from time t0) is plotted as a value of the horizontal axis is calculated as $Tha\beta$ by a least-square method.

Next, a slope of "a graph in which each shift amount of the center frequencies at time t6 to time t10 is plotted as a value of the vertical axis and each elapsed time of time t6 to time t10 (from time t0) is plotted as a value of the horizontal axis" is calculated as $Hha\beta$ by a least-square method.

The temperature coefficient $Kha\beta$ of the temperature sensor 70A in the second temperature region of the temperature rising process can be calculated as the first data, by dividing the slope $Hha\beta$ by the slope $Tha\beta$.

The data storing unit 100 calculates the temperature coefficient $Khb\beta$ of the temperature sensor 70B in the second temperature region of the temperature rising process, the temperature coefficient $Khc\beta$ of the temperature sensor 70C in the second temperature region of the temperature rising process and the temperature coefficient $Khd\beta$ of the temperature sensor 70D in the second temperature region of the temperature rising process as the first data in the way similar to the above manner.

After this, the first temperature coefficient acquisition sequence is continued, and the measured temperatures of each of the temperature sensors 70A, 70B, 70C and 70D rise to a temperature in the third temperature region, respectively.

Then, the data storing unit 100 calculates the temperature coefficient $Khb\gamma$ of the temperature sensor 70A in the third temperature region of the temperature rising process, the temperature coefficient $Khb\gamma$ of the temperature sensor 70B in the third temperature region of the temperature rising process, the temperature coefficient $Khc\gamma$ of the temperature sensor 70C in the third temperature region of the temperature rising process and the temperature coefficient $Khd\gamma$ of the temperature sensor 70D in the third temperature region of the temperature rising process as the first data in the way similar to the above manner.

As just described, the data storing unit 100 calculates the temperature coefficients of the respective the temperature sensors 70A, 70B, 70C and 70D in the respective temperature regions of the temperature rising process, as the first data, and stores these temperature coefficients.

Similarly, the temperature coefficients of each of the temperature sensors 70A, 70B, 70C and 70D in each temperature region of the temperature falling process are calculated as the second data. Specifically, the MRI apparatus 20 performs, for example, a pulse sequence in which the temperature of the gradient magnetic field coil unit 26 falls in proportion to length of elapsed time of the pulse sequence, as the second temperature coefficient acquisition sequence. For example, such a pulse sequence can be achieved by setting a repetition time to a value which is equal to or longer than 1 second, because such a short repetition time shortens the ratio of application time of a gradient magnetic field to the implementation term of the pulse sequence. Thereby, heat generation amount of the gradient magnetic field coil unit 26 can be reduced to a low value, and the temperature of the gradient magnetic field coil unit 26 can be cooled down to a low set (adjusted) temperature of the room where the gantry of the MRI apparatus 20 is installed while performing the pulse sequence.

More specifically, the cooling control device 50 heats up the cooling medium circulating inside the gradient magnetic field coil unit 26 to a temperature of approximately 60° C.

Next, after detected temperatures of each of the temperature sensors 70A, 70B, 70C and 70D converged at 60° C., the second temperature coefficient acquisition sequence is started at the start time t0'. Additionally, at time t0', the MRI apparatus 20 acquires the center frequency of magnetic resonance of hydrogen atoms of a phantom (such as water, for example), as the center frequency at time t0' by magnetic resonance spectroscopy.

Furthermore, the MRI apparatus 20 makes each of the temperature sensors 70A, 70B, 70C and 70D start performing temperature measurement at specified time intervals after time t0', and makes them input the measured temperatures per elapsed time to the data storing unit 100 in series.

Then, the data storing unit 100 acquires, for example, the center frequencies at time t1', time t2', time t3', time t4' and time t5' at which measured temperatures of each of the temperature sensors 70A, 70B, 70C and 70D are in the third temperature region, in the way similar to the case of the first data.

Next, the data storing unit 100 calculates a slope of a graph in which each measured temperature of the temperature sensor 70A at time t1' to time t5' is plotted as a value of the vertical axis and each elapsed time from time t0' of time t1' to time t5' is plotted as a value of the horizontal axis, as Traγ by a least-square method.

Next, the data storing unit 100 calculates a slope of a graph in which each shift amount of the center frequencies at time t1' to time t5' is plotted as a value of the vertical axis and each elapsed time of time t1' to time t5' (from time t0') is plotted as a value of the horizontal axis, as Hraγ by a least-square method. The aforementioned each shift amount of the center frequencies is a difference between each center frequency at time t1' to time t5' obtained by magnetic resonance spectroscopy and the center frequency at time t0'.

Next, the data storing unit 100 calculates the temperature coefficient Kraγ of the temperature sensor 70A in the third temperature region of the temperature falling process by dividing Hraγ by Traγ. The data storing unit 100 similarly calculates the temperature coefficient Krbγ of the temperature sensor 70B in the third temperature region of the temperature falling process, the temperature coefficient Krcγ of the temperature sensor 70C in the third temperature region of the temperature falling process and the temperature coefficient Krdγ of the temperature sensor 70D in the third temperature region of the temperature falling process", as the second data.

After this, the second temperature coefficient acquisition sequence is continued, and measured temperatures of the respective temperature sensors 70A, 70B, 70C and 70D falls down to a temperature in the second temperature region. Then, the data storing unit 100 calculates the temperature coefficient Kraγ of the temperature sensor 70A in the second temperature region of the temperature falling process, the temperature coefficient Krbβ of the temperature sensor 70B in the second temperature region of the temperature falling process, the temperature coefficient Krcβ of the temperature sensor 70C in the second temperature region of the temperature falling process and the temperature coefficient Krdβ of the temperature sensor 70D in the second temperature region of the temperature falling process, as the second data in the way similar to the aforementioned manner.

After this, the second temperature coefficient acquisition sequence is continued, and measured temperatures of the respective temperature sensors 70A, 70B, 70C and 70D falls down to a temperature in the first temperature region. Then, the data storing unit 100 calculates the temperature coefficient Kraα of the temperature sensor 70A in the first temperature region of the temperature falling process, the temperature coefficient Krbα of the temperature sensor 70B in the first temperature region of the temperature falling process, the temperature coefficient Krcα of the temperature sensor 70C in the first temperature region of the temperature falling process and the temperature coefficient Krdα of the temperature sensor 70D in the first temperature region of the temperature falling process, as the second data in the way similar to the aforementioned manner. As just described, the data storing unit 100 calculates the temperature coefficients of the respective temperature sensors 70A to 70D in the respective temperature regions of the temperature falling process, and stores the calculated temperature coefficients.

Although the temperature coefficients of the first data calculated in the above manner and stored in the data storing unit 100 are substantively calculated under linear approximation in each temperature region, variation of the temperature coefficients in relation to temperature variation becomes nonlinear between the respective temperature regions. That is, hysteresis the behavior of temperature variation of magnetic permeability of the iron shims is reflected on the magnetic field intensity, and consequently, the temperature coefficients nonlinearly vary in relation to temperature, depending on the hysteresis behavior (see FIG. 6 described later). The same applies to the temperature coefficients of the second data.

Note that, a determination method of the temperature coefficients is not limited to the aforementioned least-square method, but other methods may be applied. Additionally, though each temperature coefficient is defined by dividing shift amount of the center frequency by temperature variation amount, its inverse number may be defined as the temperature coefficient.

In the above first and second temperature coefficient acquisition sequences, the temperature of the cooling medium inside the gradient magnetic field coil unit 26 is controlled to become a predetermined temperature, for example, 0° C. before start of the sequence, and temperature control of the cooling medium is not performed after the start of the sequence. However, this is only an example. For example, respective temperatures detected by the temperature sensors 70A, 70B, 70C and 70D and the center frequency of magnetic resonance of hydrogen atoms of a phantom may be acquired as measured data per elapsed time, and then the temperature coefficients may be calculated as follows.

That is, the temperature coefficient acquisition sequence as a pulse sequence is not performed. Alternatively, the temperature of the cooling medium is gradually risen or fallen by the control of the cooling control device 50. During the temperature rise period or the temperature fall period of the gradient magnetic field coil unit 26 generated by the above control, respective temperatures detected by the temperature sensors 70A, 70B, 70C and 70D are acquired as measured data per elapsed time and the center frequencies of magnetic resonance of hydrogen atoms are acquired as data per elapsed time.

Additionally, in the present embodiment, temperature variation amount×temperature coefficient based on measurement results of the respective temperature sensors 70A to 70D are totaled and then averaged over all the temperature sensors 70A to 70D, and this average value is calculated as the shift amount of the center frequency. However, this is only an example.

For example, many temperature sensors spaced apart from each other in the X axis directions, the Y axis directions and the Z-axis directions of the apparatus coordinate system may be disposed in the gradient magnetic field coil unit 26, and the shift amount of the center frequency may be calculated by weighted averaging.

In this case, the product of the temperature difference (detected by each temperature sensor) times the temperature coefficient (of the corresponding temperature sensor) is multiplied by a weight coefficient, in such a manner that the higher the weight coefficient is, the closer to the imaging cross section the temperature sensor is. Then, each product of the temperature difference and the temperature coefficient multiplied by each weight coefficient is summed up for the number of temperature sensors, and the shift amount of the center frequency is calculated by dividing this summed value by the number of temperature sensors. This is inconsideration of the fact that the temperature inside the gradient magnetic field coil unit 26 does not become uniform when heat generation occurs by performing a main scan, considering the size of the gradient magnetic field coil unit 26.

Additionally, a water content tissue and a fat tissue do not have to be distinguished, because hydrogen atoms in the water content tissue in the human body and hydrogen atoms in the fat tissue in the human body experience approximately equal center frequency shifts in response to a rise (or fall) of the temperature of the gradient magnetic field coil.

Additionally, temperature rise behavior is different for each of the manufactured articles of the MRI apparatus 20, even if the same pulse sequence is performed. Therefore, it is preferable to perform the temperature coefficient acquisition sequence so as to store the obtained temperature coefficients in the data storing unit 100 per MRI apparatus during, for example, installation of the MRI apparatus.

Additionally, an example has been explained in which each of the temperature coefficients is calculated by dividing the temperature range from 0° C. to 60° C. into three temperature regions. However, embodiments of the present invention are not limited to such an aspect. The division number is not limited to three. The division number may be two or four or larger than four (width of each temperature region may be, for example, 10° C. or 15° C.). Additionally, the range of all the temperature regions may be, for example, 0° C. to 70° C., or 0° C. to 80° C.

Figure 6:
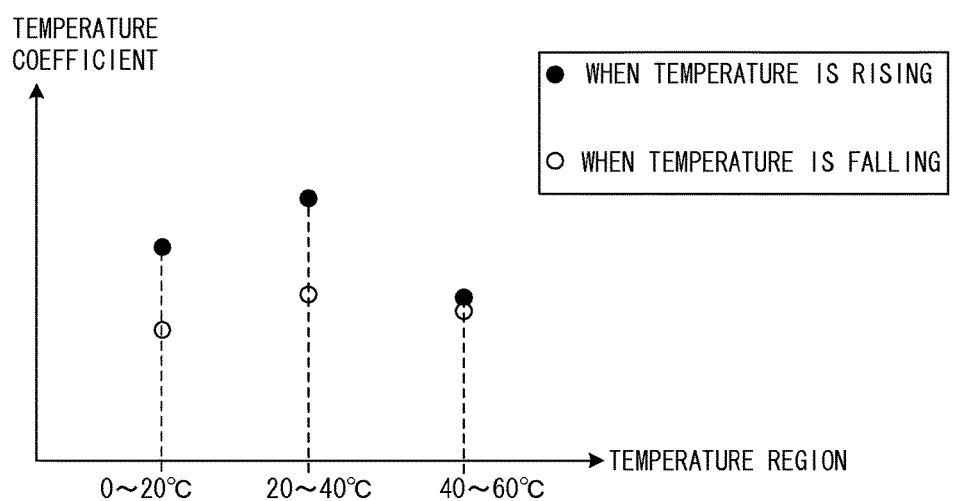
FIG. 6 is a chart illustrating averages of temperature coefficients of respective temperature sensors in the first temperature region to the third temperature region.

FIG. 6 is a chart illustrating averages of temperature coefficients of respective temperature sensors 70A, 70B, 70C and 70D in the first temperature region to the third temperature region. In FIG. 6, the horizontal axis indicates temperature (temperature region), the vertical axis indicates the temperature coefficients, blackly filled circular plots indicate the temperature coefficients of the temperature rising process, and white circular plots indicate the temperature coefficients of the temperature falling process.

That is, the average of the four temperature coefficients Kha$\alpha$, Khb$\alpha$, khc$\alpha$ and Khd$\alpha$ of the temperature sensors 70A, 70B, 70C and 70D in the first temperature region of the first data is the value of the vertical axis for the blackly filled circular plot of the first temperature region. As to the blackly filled circular plots of the second temperature region and the third temperature region, they are similarly indicated.

Additionally, the average of the four temperature coefficients Kra$\alpha$, Krb$\alpha$, krc$\alpha$ and Krd$\alpha$ of the temperature sensors 70A, 70B, 70C and 70D in the first temperature region of the second data is the value of the vertical axis for the white circular plot of the first temperature region. As to the white circular plots of the second temperature region and the third temperature region, they are similarly indicated.

The temperature coefficients of the blackly filled circular plots in FIG. 6 are values on which each slope of the hysteresis curve indicated by the solid line in each temperature region in FIG. 5 is reflected. The temperature coefficients of the white circular plots in FIG. 6 are values on which each slope of the hysteresis curve indicated by the dashed line in each temperature region in FIG. 5 is reflected.

Operation of the Present Embodiment

Figure 7:
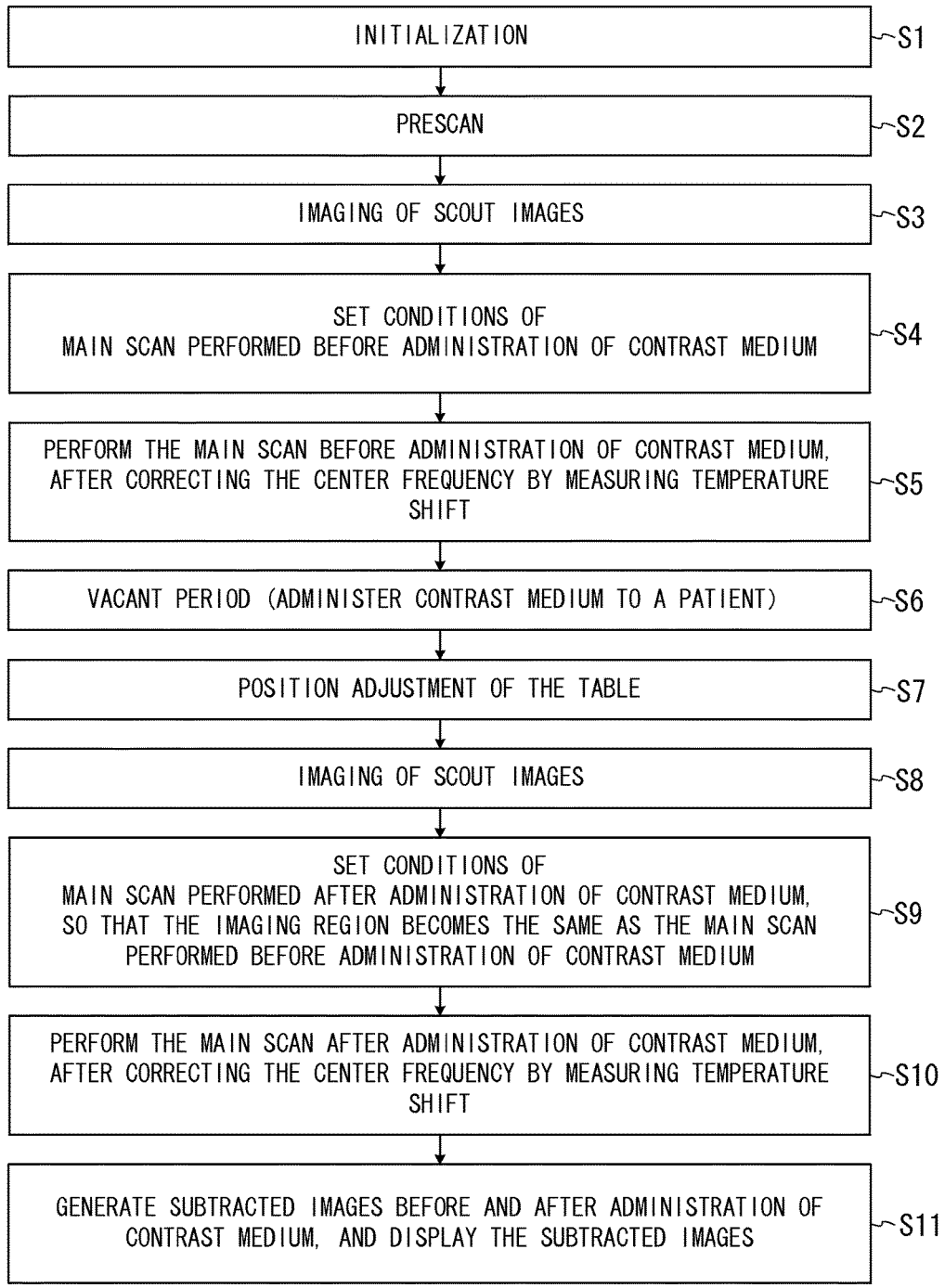
FIG. 7 is a flowchart illustrating a flow of performing imaging both before administration of contrast medium and after the administration of contrast medium, by the MRI apparatus of the present embodiment.

FIG. 7 is a flowchart illustrating a flow of performing imaging before and after the administration of contrast medium, by the MRI apparatus 20. In the following, according to the step numbers in the flowchart shown in FIG. 7, an operation of the MRI apparatus 20 will be described by referring to the aforementioned FIGS. 1 to 6 as required.

[Step S1] The MPU 86 (see FIG. 4) performs initial setting of the MRI apparatus 20 based on inputted contents on imaging conditions inputted via the input device 62. In this initial setting, some of the imaging conditions of the main scan such as an imaging part are set. The bed controlling device 52 moves the table 34 under the control of the sequence controller 56, in such a manner that the imaging part of the object P is located at the center of the magnetic field. As just described, position adjustment of the imaging part is performed.

Here, as an example, an imaging in which a vacant period is inserted before and after administration of a contrast medium. The cooling control device 50 circulates the cooling medium in the cooling pipes 76 under the control of the sequence controller 56, and thereby controls the temperature of the gradient magnetic field coil unit 26 so as to become a predetermined temperature (for example, 15° C. or 20° C. or 25° C.).

At the timing when the temperature of the gradient magnetic field coil unit 26 approximately converges at predetermined temperature, for example, just before the start of the prescan in the next Step S2, the temperature sensors 70A, 70B, 70C and 70D (see FIG. 2) respectively detect temperature inside the gradient magnetic field coil unit 26 as the initial temperature. Here, as an example, because the initial temperature is measured at the timing when the temperature just converged, the initial temperature is the same for the temperature sensors 70A to 70D. However, temperatures measured after the measurement of initial temperature may be different for each of the temperature sensors 70A, 70B, 70C and 70D. The initial temperature respectively detected by the temperature sensors 70A to 70D is inputted to the pulse setting unit 102 via the sequence controller 56.

Note that, the measurement timing of the initial temperature is not limited to the timing just before the prescan, but may be during implementation term of the prescan or after implementation of the prescan. If the temperature sensors 70A, 70B, 70C and 70D are susceptible to noise caused by a gradient magnetic field, RF pulse and so on, influence of the above noise can be avoided by performing the temperature measurement just before the prescan or after implementation of the prescan. If the temperature sensors 70A, 70B, 70C and 70D are insusceptible to noise caused by a gradient magnetic field or RF pulse, "temperature while performing the prescan" can be more accurately detected by performing the temperature measurement during implementation term of the prescan.

[Step S2] The MRI apparatus 20 calculates the provisional center frequency of RF pulses such as an excitation pulse and so on by performing the prescan. That is, the peak frequency of frequency spectrums of MR signals is detected by magnetic resonance spectroscopy, and the pulse setting unit 102 sets the provisional center frequency of RF pulses so as to accord with, for example, the center frequency of magnetic resonance of hydrogen atoms at the initial temperature, based on the peak frequency.

[Step S3] A scan to obtain scout images is performed so as to include the imaging part of the object P.

More specifically, a static magnetic field is formed in the imaging space by the static magnetic field magnet 22 excited by the static magnetic field power supply 40. In addition, electric current is supplied from the shim coil power supply 42 to the shim coil 24, thereby the static magnetic field formed in the imaging space is uniformed. Then, the sequence controller 56 drives the gradient magnetic field power supply 44, the RF transmitter 46 and the RF receiver 48 according to the pulse sequence inputted from the MPU 86, thereby a gradient magnetic field is formed in the imaging region, where the object P is set, and RF pulses are generated from the RF coil 28.

Then, MR signals generated by nuclear magnetic resonance inside the object P are received by the RF coil 28 and detected by the RF receiver 48. The RF receiver performs predetermined signal processing on the detected MR signals and then performs A/D conversion on the MR signals to generate raw data, which are digitized complex number data of the MR signals. The RF receiver 48 inputs the generated raw data to the sequence controller 56. The sequence controller 56 inputs the raw data to the image reconstruction unit 90. The image reconstruction unit 90 arranges and stores the raw data in the k-space formed in the k-space database 92 as k-space data. After this, the image reconstruction unit 90 reconstructs image data of the scout images by performing image reconstruction processing including Fourier transformation on the k-space data. The image reconstruction unit 90 inputs the reconstructed image data in the image database 94.

The image processing unit 96 generates display image data by performing predetermined image processing on the image data inputted into the image database 94. The image processing unit 96 stores the display image data in the storage device 66.

[Step S4] The display control unit 98 obtains the display image data from the storage device 66 under the command of the MPU 86, and makes the display device 64 display the scout images. Based on the scout images, some of the imaging conditions of "the main scan before administration of a contrast medium to the object P (hereinafter referred to as the first main scan)" are set by a user.

[Step S5] The bed controlling device 52 stores the current position of the table 34 as the position of implementation term of the first main scan. Additionally, each of the temperature sensors 70A, 70B, 70C and 70D measures the temperature inside the gradient magnetic field coil unit 26 as the temperature just before the first main scan and inputs the measured temperature to the pulse setting unit 102 via the sequence controller 56. Next, the pulse setting unit 102 reads in the first data and the second data from the data storing unit 100.

The pulse setting unit 102 calculates the difference obtained by subtracting the initial temperature from the temperature just before the first main scan measured by the temperature sensor 70A as $\Delta Ta1$. Similarly, the pulse setting unit 102 calculates each difference obtained by subtracting the initial temperature from each of the temperatures just before the first main scan respectively measured by the temperature sensors 70B, 70C and 70D as $\Delta Tb1$, $\Delta Tc1$ and $\Delta Td1$.

Next, the pulse setting unit 102 judges whether the temperature of the gradient magnetic field coil unit 26 has risen or fallen based on $\Delta Ta1$, $\Delta Tb1$, $\Delta Tc1$ and $\Delta Td1$. More specifically, for example, if the sign of three or four of $\Delta Ta1$, $\Delta Tb1$, $\Delta Tc1$ and $\Delta Td1$ is positive, it is judged that the temperature has risen. If the sign of three or four of $\Delta Ta1$, $\Delta Tb1$, $\Delta Tc1$ and $\Delta Td1$ is negative, it is judged that the temperature has fallen. If the sign of only two of $\Delta Ta1$, $\Delta Tb1$, $\Delta Tc1$ and $\Delta Td1$ is positive, it may be judged whether the temperature has risen or fallen based on the sign of the average value of $\Delta Ta1$, $\Delta Tb1$, $\Delta Tc1$ and $\Delta Td1$, for example.

Next, the pulse setting unit 102 determines to use the first data, if it is judged that the temperature has risen. The pulse setting unit 102 determines to use the second data, if it is judged that the temperature has fallen.

Next, the pulse setting unit 102 calculates the average temperature of the temperatures just before the first main scan respectively measured by the temperature sensors 70A, 70B, 70C and 70D. The pulse setting unit 102 determines to use the temperature coefficients of the temperature region (one of the first to the third temperature regions) to which the calculated average temperature belongs, in the data determined to use out of the first data and the second data.

For example, assume a case where it is judged that the temperature has risen and the temperature coefficients $Kha\beta$, $Khb\beta$, $khc\beta$ and $Khd\beta$ of the respective temperature sensors 70A, 70B, 70C and 70D in the second temperature region of the first data are determined to be used. In this case, the pulse setting unit 102 calculates the average of four products $\Delta Ta1 \times Kha\beta$, $\Delta Tb1 \times Khb\beta$, $\Delta Tc1 \times Khc\beta$, and $\Delta Td1 \times Khd\beta$, as an estimated shift amount $\Delta CF1$ of the center frequency. This is because the unit of the temperature coefficients is defined in such a manner that the product of temperature variation amount times the temperature coefficient is calculated as the shift amount of the center frequency.

Thus, the pulse setting unit 102 performs correction in which the center frequency CFref of RF pulses provisionally set in the prescan is shifted by the estimated shift amount $\Delta CF1$. In the case of other temperature regions, correction of the center frequency of RF pulses is similarly performed. When it is judged that the temperature has fallen and the second data is determined to be used, correction of the center frequency of RF pulses is similarly performed.

Note that, if "the temperatures just before the first main scan respectively measured by the temperature sensors 70A, 70B, 70C and 70D" practically stay unchanged against the initial temperature, the center frequency CFref provisionally set in the prescan may be directly used as the center frequency of RF pulses in the first main scan.

Then, the MRI apparatus 20 performs the first main scan under the imaging conditions determined in the Step S4, by making each component work in the way similar to the scan for the scout images. Note that, the aforementioned corrected value is used for the center frequency of RF pulses. Thereby, k-space data of the first main scan are arranged and recorded in the k-space formed in the k-space database 92. The foregoing is the operation of the first main scan.

[Step S6] At the timing just after the completion of the first main scan, each of the temperature sensors 70A, 70B, 70C and 70D measures the temperature inside the gradient magnetic field coil unit 26 as the temperatures just after the first main scan, and inputs the measured temperature to the pulse setting unit 102 via the sequence controller 56. Additionally, the bed controlling device 52 moves the table 34 to outside of the gantry, under the control of the sequence controller 56. Here, as an example, it is assumed that the vacant period starts from the timing when the table 34 is ejected from the gantry. During the vacant period, a contrast medium is administered to the object P. Additionally, as an example, it is assumed that the vacant period ends at the timing when a predetermined time span elapsed from the administration of the contrast medium.

Additionally, during the vacant period, the image reconstruction unit 90 obtains the k-space data of the first main scan from the k-space database 92, and reconstructs image data of the first main scan by performing image reconstruction processing including Fourier transformation on the obtained k-space data. The image reconstruction unit 90 stores the reconstructed image data of the first main scan in the image database 94. The image processing unit 96 obtains the image data from the image database 94 and generates display image data by performing predetermined image processing on the obtained image data, and stores the display image data in the storage device 66.

[Step S7] After the end of the vacant period, the same object P after the administration of the contrast medium is set to the same position on the table 34 as the execution time of the first main scan. The bed controlling device 52 moves the table 34 on which the object P is set to inside of the gantry under the control of the sequence controller 56. Specifically, the bed controlling device 52 moves the table 34 to the position stored in the step S5 where the first main scan was performed. That is, the position adjustment is performed in such a manner that the imaging part of the object P in the first main scan accords with the center of a magnetic field.

[Step S8] The scan for the scout images is performed in the way similar to the Step S3, so as to include the imaging part of the object P. The k-space data of MR signals acquired in this scan are reconstructed to generate image data of the scout images, and display image data of the scout images are stored in the storage device 66.

[Step S9] The display control unit 98 obtains the display image data generated in the step S8 from the storage device 66 under the command of the MPU 86, and makes the display device 64 display the scout images. Additionally, the display control unit 98 obtains the display image data of the first main scan from the storage device 66, and makes the display device 64 display the images of the first main scan.

Based on these displayed images, some of the imaging conditions of the main scan to the object P after the administration of the contrast medium (hereinafter, referred to as the second main scan) are set by a user, in such a manner that the imaging region accords with that of the first main scan.

[Step S10] Each of the temperature sensors 70A, 70B, 70C and 70D measures the temperature inside the gradient magnetic field coil unit 26 as the temperature just before the second main scan, and inputs the measured temperature to the pulse setting unit 102 via the sequence controller 56.

The pulse setting unit 102 calculates the difference obtained by subtracting the temperature just after the first main scan measured by the temperature sensor 70A from the temperature just before the second main scan measured by the temperature sensor 70A as $\Delta Ta2$. Similarly, the pulse setting unit 102 calculates each difference obtained by subtracting the temperature just after the first main scan measured by each of the temperature sensors 70B, 70C and 70D from the temperature just before the second main scan measured by each of the temperature sensors 70B, 70C and 70D as $\Delta Tb2$, $\Delta Tc2$, and $\Delta Td2$, respectively.

Next, the pulse setting unit 102 judges whether the temperature of the gradient magnetic field coil unit 26 has risen or fallen from the temperature just after the first main scan, based on $\Delta Ta2$, $\Delta Tb2$, $\Delta Tc2$ and $\Delta Td2$ in the way similar to the Step S5.

As just described, the pulse setting unit 102 judges whether the temperature has risen or fallen during the time span just before the execution of the second main scan, i.e. the vacant period. The pulse setting unit 102 determines to use the first data, if it is judged that temperature has risen. The pulse setting unit 102 determines to use the second data, if it is judged that temperature has fallen.

Next, the pulse setting unit 102 calculates the average temperature of the temperatures just before the second main scan respectively measured by the temperature sensors 70A, 70B, 70C and 70D. The pulse setting unit 102 determines to use the temperature coefficients of the temperature region to which the calculated average temperature belongs, in the data determined to use out of the first data and the second data. Additionally, the pulse setting unit 102 calculates each difference obtained by subtracting the initial temperature from the temperature just before the second main scan measured by each of the temperature sensors 70A, 70B, 70C and 70D as $\Delta Ta3$, $\Delta Tb3$, $\Delta Tc3$, and $\Delta Td3$, respectively.

For example, assume a case where it is judged that the temperature has fallen and the temperature coefficients $Kra\alpha$, $Krb\alpha$, $krc\alpha$ and $Krd\alpha$ of the respective temperature sensors 70A, 70B, 70C and 70D in the first temperature region of the second data are determined to be used. In this case, the pulse setting unit 102 calculates the average of four products: $\Delta Ta3 \times Kra\alpha$, $\Delta Tb3 \times Krb\alpha$, $\Delta Tc3 \times krc\alpha$, and $\Delta Td3 \times Krd\alpha$, as an estimated shift amount $\Delta CF3$ of the center frequency.

The pulse setting unit 102 performs correction in which the center frequency CFref of RF pulses provisionally set in the prescan is shifted by the estimated shift amount $\Delta CF3$. In the case of other temperature regions, correction of the center frequency of RF pulses is similarly performed. When it is judged that the temperature has risen and the first data is determined to be used, correction of the center frequency of RF pulses is similarly performed.

Note that, if the temperatures just before the second main scan respectively measured by the temperature sensors 70A to 70D practically stay unchanged against the the temperatures just before the first main scan respectively measured by the temperature sensors 70A to 70D, the center frequency used in the first main scan may be used in the second main scan as the center frequency of RF pulses.

Then, the MRI apparatus 20 performs the second main scan under the imaging conditions determined in the Step S9, by making each component work in the way similar to the scan for the scout images. Note that, the aforementioned value corrected in this step 10 is used for the center frequency of RF pulses. Thereby, k-space data of the second main scan are arranged and recorded in the k-space formed in the k-space database 92.

[Step S11] The image reconstruction unit 90 obtains the k-space data of the second main scan from the k-space database 92, and reconstructs image data of the second main scan by performing image reconstruction processing on the obtained k-space data. The image reconstruction unit 90 stores the reconstructed image data of the second main in the image database 94. The image processing unit 96 obtains image data of the second main scan from the image database 94, and generates display image data of the second main scan by performing predetermined image processing on the obtained image data. The image processing unit 96 stores the display image data of the second main scan in the storage device 66.

Next, the image processing unit 96 generates subtracted images (difference images). More specifically, the image processing unit 96 performs pattern matching processing between the display image data of the first main scan (mask images before the administration of the contrast medium) and the display image data of the second main scan (after the administration of the contrast medium), and thereby calculates positions of respective pixels of display image data of both first and second main scans, corresponding to the same position of the object P.

The image processing unit 96 generates the subtracted images based on the results of the pattern matching processing by subtracting each pixel value of the display image data of the first main scan from each pixel value of the display image data of the second main scan, and stores image data of the subtracted images in the storage device 66. The display control unit 98 obtains the image data of the subtracted images under the command from the MPU 86, and makes the display device 64 display the subtracted images. The foregoing is a description of an operation of the imaging before and after administration of a contrast medium.

Figure 8:
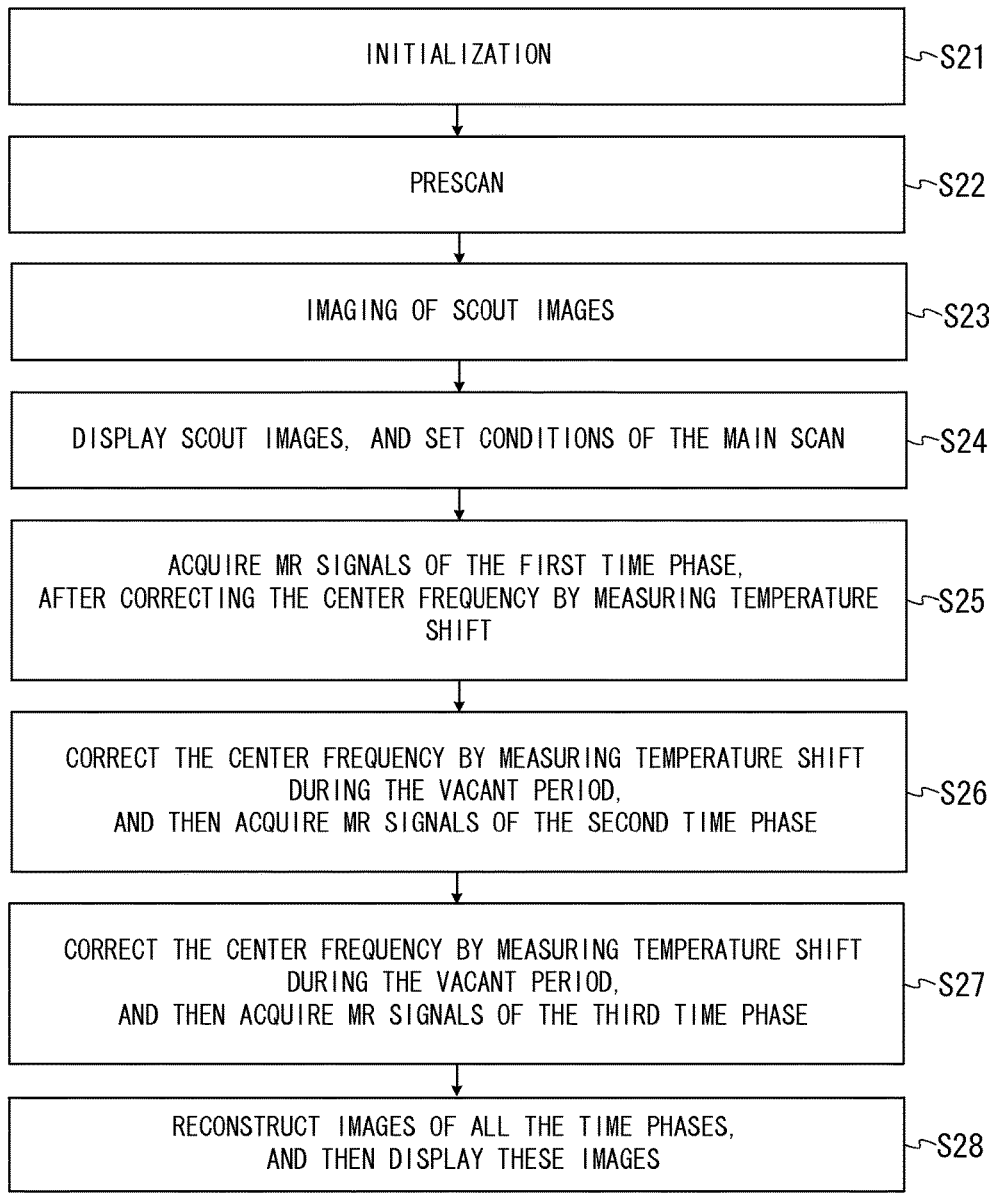
FIG. 8 is a flowchart illustrating a flow of dynamic imaging of three time phases, as another example of operation of the MRI apparatus of the present embodiment.

FIG. 8 is a flowchart illustrating a flow of dynamic imaging of three time phases, as another example of operation of the MRI apparatus 20. In the following, according to the step numbers in the flowchart shown in FIG. 8, an operation of the MRI apparatus 20 will be described.

[Step S21] The MPU 86 (see FIG. 4) performs initial setting of the MRI apparatus 20 based on inputted contents on imaging conditions inputted via the input device 62. In this initial setting, some of the imaging conditions of the main scan such as an imaging part are set. In the present embodiment, as an example, it is assumed that dynamic imaging of three time phases is set as the main scan.

In each time phase, for example, acquisition of MR signals for many slices is performed under the same imaging conditions except the center frequency of RF pulses and so on. Each length of each vacant period between each time phase of dynamic imaging is also set. Note that, transmission of a pulse and signal reception from the object P are not performed in each vacant period at all. Additionally, the number of time phase is not limited to three, and the number of slices of each time phase can be arbitrarily changed.

After this, the cooling control device 50 and the temperature sensors 70A to 70D and so on operate in the way similar to the Step S1 in FIG. 7. And each of the temperature sensors 70A, 70B, 70C and 70D detects the temperature of the gradient magnetic field coil unit 26 at the timing when the temperature of the gradient magnetic field coil unit 26 approximately converges at a predetermined temperature as the initial temperature, and inputs the measured temperature to the pulse setting unit 102.

[Step S22] The prescan is performed in the way similar to the Step S2 in FIG. 7, and thereby the MPU 86 calculate the provisional center frequency of RF pulses and so on. Here, as an example, it is assumed that the RF pulses include a fat suppression prepulse which inhibits MR signals from hydrogen atoms of fat tissues as well as an excitation pulse. The fat suppression prepulse is, for example, applied to a part of the imaging region or the entire imaging region. It is assumed that the center frequency of the excitation pulse is provisionally set as CF'ref. Additionally, it is assumed that the center frequency of the fat suppression prepulse is provisionally set as CF'fref by shifting from the center frequency CF'ref of the excitation pulse by a predetermined frequency difference based on chemical shift, for example.

[Step S23] The scan for the scout images and image reconstruction processing are performed in the way similar to the Step S3 in FIG. 7, and display image data of the scout images are stored in the storage device 66.

[Step S24] The display control unit 98 obtains the display image data from the storage device 66 under the command of the MPU 86, and makes the display device 64 display the scout images. Based on the scout images, some of the imaging conditions of the main scan are set by a user.

[Step S25] Each of the temperature sensors 70A, 70B, 70C and 70D measures the temperature inside the gradient magnetic field coil unit 26 as the temperature just before the first time phase, and inputs the measured temperature to the pulse setting unit 102 via the sequence controller 56. Next, the pulse setting unit 102 reads in the first data and the second data from the data storing unit 100.

The pulse setting unit 102 calculates each difference obtained by subtracting the initial temperature from the temperature just before the first time phase measured by each of the temperature sensors 70A, 70B, 70C and 70D as $\Delta T'a1$, $\Delta T'b1$, $\Delta T'c1$ and $\Delta T'd1$, respectively.

Next, the pulse setting unit 102 judges whether the temperature of the gradient magnetic field coil unit 26 has risen or fallen from the initial temperature, based on $\Delta T'a1$, $\Delta T'b1$, $\Delta T'c1$ and $\Delta T'd1$ in the way similar to the aforementioned Step S5. The pulse setting unit 102 determines to use the first data, if it is judged that temperature has risen. The pulse setting unit 102 determines to use the second data, if it is judged that temperature has fallen.

Next, the pulse setting unit 102 calculates the average temperature of the temperatures just before the first time phase respectively measured by the temperature sensors 70A, 70B, 70C and 70D. The pulse setting unit 102 determines to use the four temperature coefficients (respectively corresponding to the temperature sensors 70A, 70B, 70C and 70D) of the temperature region to which the calculated average temperature belongs, in the data determined to use out of the first data and the second data.

The pulse setting unit 102 calculates each product of the temperature coefficient determined to be used times temperature variation amount from the initial temperature ($\Delta T'a1$ to $\Delta T'd1$), for the respective temperature sensors 70A, 70B, 70C and 70D in the way similar to the Step S5. The pulse setting unit 102 calculates the average value of the calculated four products as the estimated shift amount $\Delta CF'1$ of the center frequency. The pulse setting unit 102 performs correction in which the center frequencies CF'ref and CF'fref of the respective RF pulses provisionally set in the prescan are shifted by the estimated shift amount $\Delta CF'1$.

Note that, if the temperatures just before the first time phase respectively measured by the temperature sensors 70A, 70B, 70C and 70D practically stay unchanged against the initial temperature, the center frequencies CF'ref (for the excitation pulse) and CF'fref (for the fat suppression prepulse) provisionally set in the prescan may be directly used as the center frequencies of the respective RF pulses in the main scan of the first time phase.

Then, the MRI apparatus 20 performs the main scan of the first time phase (acquisition of MR signals) under the imaging conditions determined in the Step S24 by similarly making each component work. Note that, the aforementioned values corrected in this Step S25 are used for the center frequencies of the RF pulses (including the aforementioned fat suppression prepulse and the excitation pulse). Thereby, k-space data of the first time phase are arranged and recorded in the k-space formed in the k-space database 92. The foregoing is the operation of acquisition of MR signals of the first time phase.

[Step S26] After the acquisition of MR signals of the first time phase, a predetermined vacant period is inserted before the acquisition of MR signals of the second time phase. During the vacant period before the second time phase, firstly, each of the temperature sensors 70A, 70B, 70C and 70D measures the temperature inside the gradient magnetic field coil unit 26 as the temperature just before the second time phase, and inputs the measured temperature to the pulse setting unit 102 via the sequence controller 56.

Next, the pulse setting unit 102 calculates each difference obtained by subtracting the temperature just before the first time phase measured by each of the temperature sensors 70A, 70B, 70C and 70D from the temperature just before the second time phase measured by each of the temperature sensors 70A, 70B, 70C and 70D as $\Delta T'a2$, $\Delta T'b2$, $\Delta T'c2$ and $\Delta T'd2$, respectively.

Next, the pulse setting unit 102 judges whether the temperature of the gradient magnetic field coil unit 26 has risen or fallen in the period before start of the second time phase, based on $\Delta T'a2$, $\Delta T'b2$, $\Delta T'c2$ and $\Delta T'd2$ in the way similar to the aforementioned Step S5. The pulse setting unit 102 determines to use the first data, if it is judged that temperature has risen. The pulse setting unit 102 determines to use the second data, if it is judged that temperature has fallen.

Next, the pulse setting unit 102 calculates the average temperature of the temperatures just before the second time phase respectively measured by the temperature sensors 70A, 70B, 70C and 70D. The pulse setting unit 102 determines to use the four temperature coefficients of the temperature region to which the calculated average temperature belongs, in the data determined to use out of the first data and the second data. Additionally, the pulse setting unit 102 calculates each difference obtained by subtracting the initial temperature from the temperature just before the second time phase measured by each of the temperature sensors 70A, 70B, 70C and 70D as $\Delta T'a3$, $\Delta T'b3$, $\Delta T'c3$ and $\Delta T'd3$, respectively.

The pulse setting unit 102 similarly calculates each product of "the temperature coefficient determined to be used" times "temperature variation amount from the initial temperature ($\Delta T'a3$ to $\Delta T'd3$)", for the respective temperature sensors 70A, 70B, 70C and 70D. The pulse setting unit 102 calculates the average value of the calculated four products as the estimated shift amount $\Delta CF'2$ of the center frequency. The pulse setting unit 102 performs correction in which "the center frequencies CF'ref and CF'fref of the respective RF pulses provisionally set in the prescan" are shifted by the estimated shift amount $\Delta CF'2$. This correction is started and finished during the vacant period.

Note that, if the temperatures just before the second time phase practically stay unchanged against the temperatures just before the first time phase as to the measured temperatures of the respective temperature sensors 70A to 70D, the center frequencies used in the first time phase may be directly used as the center frequencies in the second time phase.

Then, after elapse of the vacant period, the MRI apparatus 20 performs the main scan of the second time phase (acquisition of MR signals) under the imaging conditions determined in the Step S24 by similarly making each component work. Note that, the aforementioned values corrected in this Step S26 are used for the center frequencies of the RF pulses. Thereby, k-space data of the second time phase are arranged and recorded in the k-space formed in the k-space database 92.

[Step S27] After the acquisition of MR signals of the second time phase, a predetermined vacant period is inserted before the acquisition of MR signals of the third time phase. During the vacant period before the third time phase, each of the temperature sensors 70A, 70B, 70C and 70D measures the temperature inside the gradient magnetic field coil unit 26 as the temperature just before the third time phase, and inputs the measured temperature to the pulse setting unit 102 via the sequence controller 56.

Next, the pulse setting unit 102 calculates each difference obtained by subtracting the temperature just before the second time phase measured by each of the temperature sensors 70A, 70B, 70C and 70D from the temperature just before the third time phase measured by each of the temperature sensors 70A, 70B, 70C and 70D as $\Delta T'a4$, $\Delta T'b4$, $\Delta T'c4$ and $\Delta T'd4$, respectively.

Next, the pulse setting unit 102 judges whether the temperature of the gradient magnetic field coil unit 26 has risen or fallen in the period before start of the third time phase, based on $\Delta T'a4$, $\Delta T'b4$, $\Delta T'c4$ and $\Delta T'd4$ in the way similar to the aforementioned Step S5. The pulse setting unit 102 determines to use the first data, if it is judged that temperature has risen. The pulse setting unit 102 determines to use the second data, if it is judged that temperature has fallen.

Next, the pulse setting unit 102 calculates the average temperature of "the temperatures just before the third time phase respectively measured by the temperature sensors 70A, 70B, 70C and 70D". The pulse setting unit 102 determines to use the four temperature coefficients of "the temperature region to which the calculated average temperature belongs", in the data determined to use out of the first data and the second data. Additionally, the pulse setting unit 102 calculates each difference obtained by subtracting "the initial temperature" from "the temperature just before the third time phase measured by each of the temperature sensors 70A, 70B, 70C and 70D" as $\Delta T'a5$, $\Delta T'b5$, $\Delta T'c5$ and $\Delta T'd5$, respectively.

The pulse setting unit 102 similarly calculates each product of the temperature coefficient determined to be used times temperature variation amount from the initial temperature ($\Delta T'a5$ to $\Delta T'd5$), for the respective temperature sensors 70A, 70B, 70C and 70D. The pulse setting unit 102 calculates the average value of the calculated four products as the estimated shift amount $\Delta CF'3$ of the center frequency. The pulse setting unit 102 performs correction in which the center frequencies CF'ref and CF'fref of the respective RF pulses provisionally set in the prescan are shifted by the estimated shift amount $\Delta CF'3$. This correction is started and finished during the vacant period.

Note that, if the temperatures just before the third time phase practically stay unchanged against the temperatures just before the second time phase as to the measured temperatures of the respective temperature sensors 70A to 70D, the center frequencies used in the second time phase may be directly used as the center frequencies in the third time phase.

Then, after elapse of the vacant period, the MRI apparatus 20 performs the main scan of the third time phase under the imaging conditions determined in the Step S24 by similarly making each component work. Note that, the aforementioned values corrected in this Step S27 are used for the center frequencies of the RF pulses. Thereby, k-space data of the third time phase are arranged and recorded in the k-space formed in the k-space database 92.

[Step S28] The image reconstruction unit 90 obtains the k-space data from the k-space database 92, and reconstructs image data of each slice of all the time phases by performing image reconstruction processing on the obtained k-space data. The image reconstruction unit stores the reconstructed image data in the image database 94. The image processing unit 96 obtains the image data of each slice of all the time phases from the image database 94, generates display image data by performing predetermined image processing on the obtained image data, and stores these display image data in the storage device 66. Then, the images of all the time phases are displayed on the display device 64, for example, as motion picture. The foregoing is a description of an operation of dynamic imaging performed by the MRI apparatus 20.

As just described, according to the present embodiment, the temperature coefficients groups which stipulate relationship between the temperature variation amount of the gradient magnetic field coil unit 26 and the shift amount of the center frequency of magnetic resonance of hydrogen atoms are preliminarily stored as the first data and the second data in the data storing unit 100. Then, the temperature variation amount of the gradient magnetic field coil unit 26 is measured at a plurality of (mutually different) time points during imaging, and the center frequency of RF pulses is corrected based on the temperature coefficients so as to accord with the center frequency of magnetic resonance of hydrogen atoms in the case where the measured temperature variation occurs.

Thus, regardless of shift of the center frequency of magnetic resonance of hydrogen atoms caused by heat generation of a gradient magnetic field coil, the center frequency of RF pulses are corrected so as to accord with the actual center frequency of magnetic resonance of hydrogen atoms, and thereby images with satisfactory image quality can be obtained. This is because the center frequency of RF pulses such as the fat suppression prepulse is corrected (Step S25, S26, S27) so as to follow the shift of the center frequency of magnetic resonance of hydrogen atoms caused by temperature variation, and thus effect of the fat suppression prepulse and so on does not become depleted even if imaging time becomes long.

Additionally, the longer imaging time is (like, for example, dynamic imaging), the more likely to rise the temperature of the gradient magnetic field coil unit 26 is. However, in the present embodiment, temperature measurement and correction of the center frequency are repeated after the start of the main scan, and thereby effect of the correction of the center frequency is prominently manifested.

Additionally, the pulse setting unit 102 calculates the estimated shift amount of the center frequency by using the temperature coefficients obtained for the two divided cases of temperature rise and temperature fall, considering the hysteresis behavior of temperature variation of magnetic permeability of the iron shims. Therefore, the center frequency of magnetic resonance can be calculated more accurately. Although the temperature of the gradient magnetic field coil unit 26 gradually rises along with continuation of execution of a pulse sequence in general, the present embodiment is especially effective for a case having a possibility of temperature fall caused by, for example, a comparatively long vacant period inserted between imaging before administration of a contrast medium and imaging after administration of contrast medium.

Moreover, in the present embodiment, the temperature coefficients are preliminarily obtained for a plurality of temperature regions of temperature rise case and a plurality of temperature regions of temperature fall case considering the above hysteresis behavior, and the estimated shift amount of the center frequency of magnetic resonance of hydrogen atoms is calculated by using the above temperature coefficients. Therefore, the center frequency of magnetic resonance can be more precisely calculated.

As just describe, in the present embodiment, because the MRI apparatus 20 can follow change of the center frequency of magnetic resonance of hydrogen atoms, cooling function for the gradient magnetic field coil unit 26 can be minimized and thereby expense for cooling can be reduced. Additionally, the gradient magnetic field coil unit 26 with high thermal conductivity (i.e. low thermal capacity) can be used, because the MRI apparatus 20 can follow change of the center frequency of magnetic resonance of hydrogen atoms.

Figure 9:
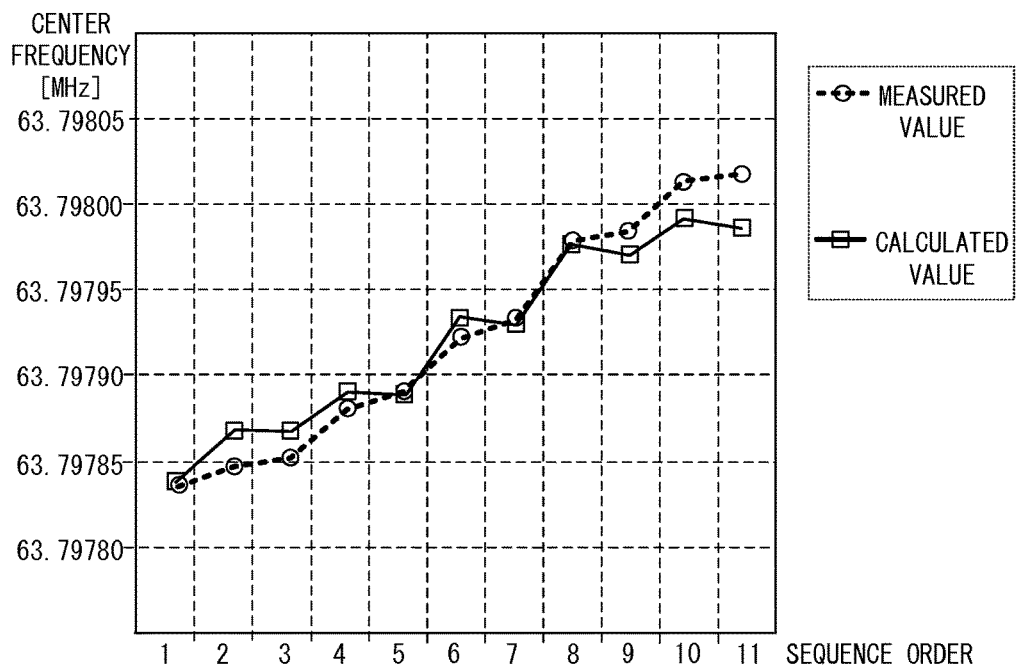
FIG. 9 is a chart showing an example of comparison between center frequencies in implementation term of respective pulse sequences calculated by the method of the present embodiment and the measured center frequencies in implementation term of the respective pulse sequences, when eleven pulse sequences are performed in series.

FIG. 9 is a chart showing an example of comparison between center frequencies in implementation term of respective pulse sequences calculated by the method of the present embodiment and the measured center frequencies in implementation term of the respective pulse sequences, when eleven pulse sequences are performed in series.

In this example, under application of a static magnetic field whose intensity is mutually around 1.5 tesla, the first to the eleventh pulse sequences are performed. The vertical axis in FIG. 9 indicates the center frequency of magnetic resonance of hydrogen atoms inside a phantom, and its unit is megahertz. The horizontal axis in FIG. 9 indicates execution order of the first to the eleventh pulse sequences, and corresponds to elapsed time from the start time of the first (entire) pulse sequence. In FIG. 9, the dashed line connecting circular plots with black rim and white inside indicates measured values, and the solid line connecting tetragonal plots with black rim and white inside indicates calculated values.

Figure 10:
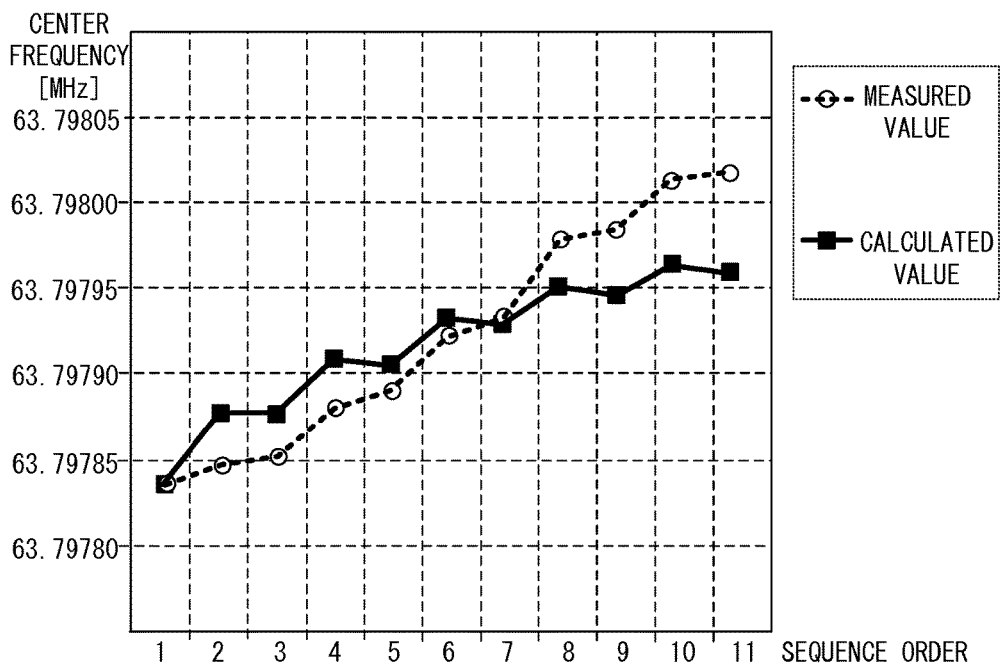
FIG. 10 is a chart showing an example of comparison between the center frequencies in implementation term of the respective pulse sequences calculated by a method different from the present embodiment and the measured center frequencies in implementation term of the respective pulse sequences, when the same eleven pulse sequences as the case of FIG. 9 are performed in series.

FIG. 10 is a chart showing an example of comparison between the center frequencies in implementation term of the respective pulse sequences calculated by a method different from the present embodiment and the measured center frequencies in implementation term of the respective pulse sequences, when the same eleven pulse sequences as the case of FIG. 9 are performed in series.

Thus, in FIG. 10, the dashed line connecting circular plots with black rim and white inside indicates the same measured values as FIG. 9. Note that, the tetragonal plots connected with the solid line indicating calculated values are filled with black for distinguishing FIG. 10 from FIG. 9.

In the method different from the present embodiment, the temperature coefficients whose number is the same as the number of temperature sensors are acquired by performing a temperature coefficient acquisition sequence without dividing into plural temperature regions, under the assumption that the temperature of the gradient magnetic field coil unit 26 rises without temporal fall during implementation term of a pulse sequence. In this method, temperature variation amount from the initial temperature before start of each pulse sequence is calculate for each temperature sensor, under the simplified assumption that the shift amount of the center frequency linearly varies in relation to temperature variation over the entire temperature range. Then, the product of the temperature variation amount times the temperature coefficient is calculated for the number of the temperature sensors, and the average value of these products are calculated as the estimated amount of the center frequency.

Then, the center frequency during implementation term of each pulse sequence is calculate by shifting the center frequency provisionally set during implementation term of a prescan (during measurement of the initial temperature) by the estimated amount calculated.

As shown by comparison between FIG. 9 and FIG. 10, the center frequencies calculated in the method of the present embodiment are closer to measured values than the center frequencies calculated in the method of FIG. 10. This is because the temperature coefficients in the present embodiment are preliminarily obtained by dividing into two cases of temperature rise and temperature fall, and further dividing into plural temperature regions, considering the hysteresis behavior of temperature variation of magnetic permeability of the iron shims, and thereby the center frequency can be more exactly calculated in the present embodiment.

According to the aforementioned embodiment, a novel technology to obtain a high-quality image regardless of shift of a center frequency of magnetic resonance of hydrogen atoms caused by heat generation of a gradient magnetic field coil can be provided in MRI.

Supplementary Notes for Embodiment

[1] In the flow of FIG. 7 and FIG. 8, 'examples in which the estimated shift amount is calculated by multiplying the difference between the initial temperature and the current temperature by the temperature coefficient, and the center frequency is corrected by shifting the center frequency provisionally set in the prescan by the estimated shift amount, over all the sequences of follow-on main scans' has been explained. However, this is only an example of correction methods of the center frequency of RF pulses. For example, the estimated shift amount is calculated by multiplying the difference between the temperature measured previous time and the current temperature by the temperature coefficient, and the center frequency is corrected by shifting the center frequency used in the previous main scan by the estimated shift amount.

[2] This embodiment can be applied to not only the dynamic imaging and imaging before and after administration of contrast medium but also other imaging sequences, such as diffusion weighted imaging.

[3] Although an example has been described in which the estimated shift of the center frequency of the magnetic resonance of hydrogen atoms is calculated, and the center frequency of the RF pulse is corrected based on the estimated shift, the embodiments of the present invention are not limited to such an implementation. As a technically equivalent alternative, the center frequency of the magnetic resonance of hydrogen atoms itself may be estimated, and the center frequency of the RF pulse may be corrected based on the estimated center frequency.

[4] An example in which the temperature coefficients are preliminarily acquired based on measured values obtained by performing the first temperature coefficient acquisition sequence and the second temperature coefficient acquisition sequence has been explained. However, the embodiments of the present invention are not limited to such an implementation. For example, the temperature coefficients of the respective temperature sensors 70A, 70B, 70C and 70D for the respective temperature regions in the first data may be preliminarily obtained by simulation based on structure of the gantry, the X axis gradient magnetic field coil 26mx, the Y axis gradient magnetic field coil 26my, the Z axis gradient magnetic field coil 26mz, the X axis shield coil 26sx, the Y axis shield coil 26sy, the Z axis shield coil 26sz and so on so as to vary nonlinearly according to the hysteresis behavior of temperature variation of magnetic permeability of the iron shims, and then may be stored in the data storing unit 100. The same applies to the temperature coefficients of the respective temperature sensors 70A, 70B, 70C and 70D for the respective, temperature regions in the second data.

[5] The number of measurement times of the temperature of the gradient magnetic field coil unit 26 by the respective temperature sensors 70A, 70B, 70C and 70D is not limited to plural times, but may be one time. For example, when power activation is performed after a long period of time has passed from power-off timing of the MRI apparatus 20 and then the first main scan is performed, temperature measurement of the gradient magnetic field coil unit 26 may be performed only once just before this main scan.

More concretely, the cooling control device 50 controls the temperature of the gradient magnetic field coil unit 26 so as to become a target temperature. The above target temperature means a predetermined temperature as the initial temperature before running of the gradient magnetic field coil unit 26, and is (preliminarily) stored in the cooling control device 50 and the pulse setting unit 102 before setting of imaging conditions.

The temperature of the gradient magnetic field coil unit 26 is nearly equal to a room temperature after a long period of time has passed from power-off, and it is improbable that a long period of time is needed to cool down the gradient magnetic field coil unit 26. Thus, the temperature of the gradient magnetic field coil unit 26 is nearly equal to the above target temperature, if a long period of time has elapsed after power-off, power activation was performed and then a predetermined time has elapsed. In this case, the pulse setting unit 102 can judge "whether the temperature is rising or falling" by comparing the above target temperature with the temperature of the gradient magnetic field coil unit 26 measured just before the main scan, and can calculate the temperature variation amount. Thereby, the MRI apparatus 20 can similarly correct the center frequency and perform magnetic resonance imaging.

[6] An example has been described in which as the MRI apparatus 20 the RF receiver 48 is disposed outside the gantry that includes the static magnetic field magnet 22, the shim coil 24, the gradient magnetic field coil unit 26 and the like (see FIG. 1). However, the embodiment of the present invention is not limited to such an implementation. The RF receiver 48 may be included in the gantry.

Specifically, for example, an electronic circuit board that is equivalent to the RF receiver 48 may be disposed in the gantry. Then, the MR signals, which are analog electrical signals converted from the electromagnetic wave by the receiving RF coil 28, may be amplified by a pre-amplifier in the electronic circuit board, the amplified signals may be outputted to the outside of the gantry as digital signals and inputted to the sequence controller 56. In outputting the signals to the outside of the gantry, an optical communication cable is preferably used to transmit the signals in the form of optical digital signals because the effect of external noise is reduced, for example.

[7] Correspondences between terms used in the claims and terms used in the embodiment described above will be described. Note that the correspondences described below are just some of possible interpretations for reference and should not be construed as limiting the present invention.

The entire functions of the static magnetic field magnet 22, the shim coil 24, the gradient magnetic field coil unit 26, the RF coils 28 and the control device 30 (see FIG. 1) that acquires MR signals from the object P by a scan with application of gradient magnetic fields and RF pulses and the functions of the operation device 60 that generates image data of the object P based on the acquired MR signals are an example of an imaging unit described in the claims.

The temperature sensors 70A, 70B, 70C and 70D are an example of a temperature measuring unit described in the claims.

The temperature coefficients preliminarily stored in the data storing unit 100 in such a manner that the respective temperature coefficients correspond to temperature rise time or temperature declination time and are classified into a plurality of temperature regions are examples of shift data and ratios as the first data and second data described in the claims.

The respective main scans (acquisition of MR signals) in the first time phase to the third time phase are examples of a data acquisition sequence described in the claims.

[8] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
   a gradient magnetic field coil unit configured to generate a gradient magnetic field in an imaging region according to a current supplied thereto;
   a temperature measuring unit configured to perform temperature measurement of the gradient magnetic field coil unit;
   a data storing unit configured to store
      (a) a first ratio as first data indicating a first relationship between temperatures and shift amounts of a center frequency of magnetic resonance of a hydrogen atom in the imaging region, the first relationship corresponding to a first case where the temperature increases from a first temperature toward a second temperature higher than the first temperature, and
      (b) a second ratio as second data indicating a second relationship between the temperatures and the shift amounts of the center frequency, the second relationship corresponding to a second case where the temperature decreases from the second temperature toward the first temperature,
   a pulse setting unit configured to determine whether the temperature of the gradient magnetic field coil unit has increased or decreased based on result of the temperature measurement, calculate an estimated shift of the center frequency of magnetic resonance, using the first data when the temperature has increased, while using the second data when the temperature has decreased and correct a center frequency of an RE pulse based on the estimated shift; and
   an imaging unit configured to transmit the RF pulse corrected by the pulse setting unit, acquire nuclear magnetic resonance signals from an object in the imaging region, and generate image data of the object based on the nuclear magnetic resonance signals,
   wherein the gradient magnetic coil unit includes iron shims which correct non-uniformity of a static magnetic field, and
   the first and second ratios are acquired for a plurality of temperature regions, and are defined so as to vary nonlinearly according to hysteresis behavior of temperature variation of magnetic permeability of the iron shims between each of the temperature regions.

2. The magnetic resonance imaging apparatus according to claim 1, wherein the data storing unit is configured to store a plurality of shift data which correspond to the plurality of temperature regions respectively and indicate shift of the center frequency of magnetic resonance in response to temperature variation of the gradient magnetic field coil unit.

3. The magnetic resonance imaging apparatus according to claim 2, wherein the plurality of shift data include the first and second ratios, and each of the first and second ratios is acquired for each of the temperature regions, each of the first and second ratios defining a proportion of a temperature variation amount based on temperature measured by the temperature measurement unit to a shift amount of the center frequency of magnetic resonance of a hydrogen atom.

4. The magnetic resonance imaging apparatus according to claim 1, wherein the pulse setting unit is configured to calculate the estimated shift by using a temperature variation amount of the gradient magnetic field coil unit based on result of the temperature measurement and data corresponding to result of a judgment out of the first data and the second data.

5. The magnetic resonance imaging apparatus according to claim 4, wherein
   the imaging unit is configured to perform a plurality of data acquisition sequences to acquire the nuclear magnetic resonance signals used to generate a plurality of images in chronological order;
   the temperature measurement unit is configured to measure temperature of the gradient magnetic field coil unit before performance of each of the data acquisition sequences; and
   the pulse setting unit is configured to correct the center frequency of the RF pulse before performance of each of the data acquisition sequences.

6. The magnetic resonance imaging apparatus according to claim 5, wherein the imaging unit is configured to apply a fat suppression prepulse as the RF pulse to at least a part of the imaging region before acquiring the nuclear magnetic signals from the object.

7. The magnetic resonance imaging apparatus according to claim 4, wherein
   the imaging unit is configured to perform dynamic imaging whose time phases respectively include acquisition of the nuclear magnetic resonance signals used to generate a plurality of images by inserting a vacant time between each time phase;
   the temperature measurement unit is configured to measure temperature of the gradient magnetic field coil unit during the vacant time; and
   the pulse setting unit is configured to correct the center frequency of the RE pulse during the vacant time.

8. The magnetic resonance imaging apparatus according to claim 7, wherein the imaging unit is configured to apply a fat suppression prepulse as the RF pulse to at least a part of the imaging region before acquiring the nuclear magnetic signals from the object.

9. The magnetic resonance imaging apparatus according to claim 4, wherein
   the imaging unit is configured to perform a first data acquisition sequence to acquire the nuclear magnetic resonance signals from an object before administration of a contrast medium, and then perform a second data acquisition sequence to acquire the nuclear magnetic resonance signals from a same object having undergone administration of a contrast medium after elapse of a vacant time from completion of the first data acquisition sequence;

the temperature measurement unit is configured to measure respective temperatures of the gradient magnetic field coil unit before and after the vacant time; and the pulse setting unit is configured to perform a judgment and correct the center frequency of the RF pulse based on result of the judgment, during a time span just before performance of the second data acquisition sequence.

10. The magnetic resonance imaging apparatus according to claim 1, wherein the imaging unit is configured to perform a plurality of data acquisition sequences to acquire the nuclear magnetic resonance signals used to generate a plurality of images in chronological order;

the temperature measurement unit is configured to measure temperature of the gradient magnetic field coil unit before performance of each of the data acquisition sequences; and the pulse setting unit is configured to correct the center frequency of the RF pulse before performance of each of the data acquisition sequences.

11. The magnetic resonance imaging apparatus according to claim 1, wherein the imaging unit is configured to perform dynamic imaging whose time phases respectively include acquisition of the nuclear magnetic resonance signals used to generate a plurality of images by inserting a vacant time between each time phase;

the temperature measurement unit is configured to measure temperature of the gradient magnetic field coil unit during the vacant time; and the pulse setting unit is configured to correct the center frequency of the RF pulse during the vacant time.

12. The magnetic resonance imaging apparatus according to claim 1, wherein the imaging unit is configured to perform a first data acquisition sequence to acquire the nuclear magnetic resonance signals from an object before administration of a contrast medium, and then perform a second data acquisition sequence to acquire the nuclear magnetic resonance signals from a same object having undergone administration of a contrast medium after elapse of a vacant time from completion of the first data acquisition sequence;

the temperature measurement unit is configured to measure respective temperatures of the gradient magnetic field coil unit before and after the vacant time; and the pulse setting unit is configured to perform a judgment and correct the center frequency of the RF pulse based on result of the judgment, during a time span just before performance of the second data acquisition sequence.

13. The magnetic resonance imaging apparatus according to claim 3, wherein the temperature measurement unit is configured to measure temperature of the gradient magnetic field coil unit once, before performance of a main scan by the imaging unit; and the pulse setting unit is configured to store a predetermined temperature as a temperature of the gradient magnetic field coil unit before operation, and perform a judgment by comparing the temperature of the gradient magnetic field coil unit measured by the temperature measurement unit with the predetermined temperature.

14. A magnetic resonance imaging apparatus, comprising:

a gradient magnetic field coil unit configured to generate a gradient magnetic field in an imaging region according to a current supplied thereto;

a temperature measuring unit configured to perform temperature measurement of the gradient magnetic field coil unit;

a data storing unit configured to store a plurality of shift data which correspond to a plurality of temperature regions respectively and indicate shift of a center frequency of magnetic resonance of a hydrogen atom in the imaging region in response to temperature variation of the gradient magnetic field coil unit;

a pulse setting unit configured to calculate an estimated shift of the center frequency of magnetic resonance of a hydrogen atom based on temperature shift of the gradient magnetic field coil unit indicated by the temperature measurement and the shift data corresponding to one of a plurality of temperature regions including temperature of the gradient magnetic field coil unit indicated by the temperature measurement, and correct a center frequency of an RF pulse based on the estimated shift; and an imaging unit configured to transmit the RF pulse corrected by the pulse setting unit, acquire nuclear magnetic resonance signals from an object in the imaging region, and generate image data of the object based on the nuclear magnetic resonance signals, wherein the gradient magnetic coil unit includes iron shims which correct non-uniformity of a static magnetic field, and each of the plurality of shift data corresponds to a ratio of the shift of the center frequency to the temperature variation, and the ratio is defined so as to vary nonlinearly according to hysteresis behavior of temperature variation of magnetic permeability of the iron shims between each of the temperature regions.

15. The magnetic resonance imaging apparatus according to claim 14, wherein the imaging unit is configured to perform dynamic imaging whose time phases respectively include acquisition of the nuclear magnetic resonance signals used to generate a plurality of images by inserting a vacant time between each time phase;

the temperature measurement unit is configured to measure temperature of the gradient magnetic field coil unit during the vacant time; and the pulse setting unit is configured to correct the center frequency of the RF pulse during the vacant time.

16. The magnetic resonance imaging apparatus according to claim 14, wherein the imaging unit is configured to apply a fat suppression prepulse as the RF pulse to at least a part of the imaging region before acquiring the nuclear magnetic signals from the object.

17. A magnetic resonance imaging method comprising the steps of:

performing temperature measurement of a gradient magnetic field coil unit of a magnetic resonance apparatus;

performing judgment as to whether temperature of the gradient magnetic field coil unit has risen or fallen, based on result of the temperature measurement;

calculating an estimated shift of a center frequency of magnetic resonance of a hydrogen atom in an imaging region based on data corresponding to result of the judgment out of first data corresponding to a case of temperature rise of the gradient magnetic field coil unit and second data corresponding to a case of temperature fall of the gradient magnetic field coil unit, the first and second data indicating a shift of the center frequency of magnetic resonance;

correcting a center frequency of an RF pulse based on the estimated shift;

acquiring nuclear magnetic resonance signals from an object in the imaging region by transmitting the RF pulse whose center frequency is corrected based on the estimated shift; and generating image data of the object based on the nuclear magnetic resonance signals, wherein the gradient magnetic coil unit includes iron shims which correct non-uniformity of a static magnetic field, and each of the first and second data corresponds to a ratio of the shift of the center frequency to the temperature variation, and the ratio is defined so as to vary nonlinearly according to hysteresis behavior of temperature variation of magnetic permeability of the iron shims between each of the temperature regions.

* * * * *